(12) United States Patent
Clark et al.

(10) Patent No.: US 10,658,144 B2
(45) Date of Patent: May 19, 2020

(54) SHADOWED GRID STRUCTURES FOR ELECTRODES IN VACUUM ELECTRONICS

(71) Applicant: Modern Electron, LLC, Bellevue, WA (US)

(72) Inventors: Stephen E. Clark, Issaquah, WA (US);
Chloe A. M. Fabien, Seattle, WA (US);
Gary D. Foley, Mill Creek, WA (US);
Arvind Kannan, Bellevue, WA (US);
Andrew T. Koch, Seattle, WA (US);
Andrew R. Lingley, Seattle, WA (US);
Hsin-I Lu, Mercer Island, WA (US);
Max N. Mankin, Seattle, WA (US);
Tony S. Pan, Bellevue, WA (US);
Jason M. Parker, Redmond, WA (US);
Peter J. Scherpelz, Seattle, WA (US);
Yong Sun, Belle Mead, NJ (US);
Chuteng Zhou, Cambridge, MA (US)

(73) Assignee: Modern Electron, LLC, Bellevue, WA (US)

( * ) Notice: Subject to any disclaimer, the term of this patent is extended or adjusted under 35 U.S.C. 154(b) by 0 days.

(21) Appl. No.: 16/041,639

(22) Filed: Jul. 20, 2018

(65) Prior Publication Data

US 2019/0043685 A1 Feb. 7, 2019

Related U.S. Application Data

(60) Provisional application No. 62/679,023, filed on Jun. 1, 2018, provisional application No. 62/637,919, filed
(Continued)

(51) Int. Cl.
*H01J 19/42* (2006.01)
*H01J 1/46* (2006.01)
(Continued)

(52) U.S. Cl.
CPC .......... *H01J 19/42* (2013.01); *H01J 1/46* (2013.01); *H01J 19/02* (2013.01); *H01L 29/43* (2013.01); *H01J 2893/0002* (2013.01)

(58) Field of Classification Search
CPC .... H01J 19/42; H01J 19/02; H01J 1/46; H01J 2893/0002; H01L 29/43
See application file for complete search history.

(56) References Cited

U.S. PATENT DOCUMENTS 3,041,481 A 6/1962 Peters et al.
3,154,711 A 10/1964 Beggs
(Continued)

FOREIGN PATENT DOCUMENTS

| EP | 0971386 A2 | 1/2000 |
|---|---|---|
| JP | 2257540 | 10/1990 |
| JP | 492345 | 3/1992 |

OTHER PUBLICATIONS

Hatsopoulos, et al., Thermionic Energy Conversion, vol. II: Theory, Technology, and Application, pp. 591-614, Chapter 16, The MIT Press, Cambridge, Massachusetts, and London, England.

*Primary Examiner* — Kevin Quarterman
(74) *Attorney, Agent, or Firm* — Robert R. Richardson, P.S.

(57) ABSTRACT

Disclosed embodiments include vacuum electronics devices and methods of fabricating a vacuum electronics device. In a non-limiting embodiment, a vacuum electronics device includes: an electrode; a plurality of grid supports disposed on the electrode, each of the plurality of grid supports having a first width; and a plurality of grid lines, each of the plurality of grid lines being supported on an associated one of the plurality of grid supports, each of the plurality of grid lines having a second width that is wider than the first width.

27 Claims, 12 Drawing Sheets

Related U.S. Application Data on Mar. 2, 2018, provisional application No. 62/535,826, filed on Jul. 22, 2017.

(51) Int. Cl.
*H01J 19/02* (2006.01)
*H01L 29/43* (2006.01)

(56) References Cited

U.S. PATENT DOCUMENTS

| | | | |
|---|---|---|---|
| 3,484,645 A | 12/1969 | Drees | |
| 3,755,704 A | 8/1973 | Spindt et al. | |
| 4,471,267 A | 9/1984 | Amboss | |
| 4,528,474 A | 7/1985 | Kim | |
| 4,771,201 A | 9/1988 | Free | |
| 4,983,878 A | 1/1991 | Lee et al. | |
| 5,203,731 A * | 4/1993 | Zimmerman | H01J 9/025 445/24 |
| 5,259,799 A | 11/1993 | Doan et al. | |
| 5,430,347 A | 7/1995 | Kane et al. | |
| 5,493,177 A | 2/1996 | Muller et al. | |
| 5,578,901 A | 11/1996 | Blanchet-Fincher et al. | |
| 5,686,782 A | 11/1997 | Hecker, Jr. et al. | |
| 5,786,795 A * | 7/1998 | Kishino | G09G 3/22 345/75.2 |
| 5,851,669 A * | 12/1998 | Macaulay | B82Y 10/00 428/401 |
| 5,955,850 A * | 9/1999 | Yamaguchi | H01J 3/022 313/495 |
| 6,135,839 A * | 10/2000 | Iwase | H01J 3/022 445/24 |
| 6,204,597 B1 | 3/2001 | Xie et al. | |
| 6,489,710 B1 * | 12/2002 | Okita | H01J 9/025 313/309 |
| 6,987,027 B2 | 1/2006 | Jin | |
| 7,005,783 B2 | 2/2006 | Hwu et al. | |
| 9,666,401 B2 | 5/2017 | Park et al. | |
| 9,865,789 B2 | 1/2018 | Geballe et al. | |
| 2002/0142523 A1 | 10/2002 | Ryu et al. | |
| 2003/0001490 A1 * | 1/2003 | Yamamoto | H01J 1/3042 313/495 |
| 2003/0146689 A1 | 8/2003 | Hwu et al. | |
| 2004/0027053 A1 | 2/2004 | Amey | |
| 2004/0104656 A1 | 6/2004 | Wilson | |
| 2005/0230750 A1 * | 10/2005 | Nakano | H01J 3/021 257/341 |
| 2005/0258514 A1 | 11/2005 | Smith et al. | |
| 2005/0266766 A1 | 12/2005 | Wei et al. | |
| 2007/0046175 A1 * | 3/2007 | Hwang | H01J 1/304 313/496 |
| 2007/0252510 A1 * | 11/2007 | Ha | H01J 29/467 313/495 |
| 2009/0039754 A1 * | 2/2009 | Tolt | H01J 3/022 313/310 |
| 2013/0230146 A1 * | 9/2013 | Kim | H01J 3/021 378/122 |
| 2016/0141382 A1 | 5/2016 | Mankin et al. | |
| 2016/0196948 A1 | 7/2016 | Kim et al. | |

* cited by examiner

SHADOWED GRID STRUCTURES FOR ELECTRODES IN VACUUM ELECTRONICS

CROSS-REFERENCE TO RELATED APPLICATIONS

The present application is related to, and claims the benefit of priority of the filing date of, the following U.S. Provisional Patent Applications, all of which are herein incorporated by reference in their entirety: U.S. Provisional Patent Application No. 62/535,826, filed Jul. 22, 2017; U.S. Provisional Patent Application No. 62/637,919, filed Mar. 2, 2018; and U.S. Provisional Patent Application No. 62/679,023, filed Jun. 1, 2018.

TECHNICAL FIELD

The present disclosure relates to vacuum electronics devices.

BACKGROUND

Vacuum electronics devices include devices such as field emitter arrays, vacuum tubes, electric thrusters, gyrotrons, klystrons, travelling wave tubes, thermionic converters, and the like. In vacuum electronics devices, it may be beneficial to place a conductive grid (for example, a control grid, suppressor grid, screen grid, accelerator grid, focus grid, or the like) closely adjacent to an electrode (for example, a cathode or an anode). Such a grid may use a bias voltage to control and/or modulate the flow of charged particles in the vacuum electronics device.

Integrated grids are monolithic structures which integrate the grids and the electrodes. Integrated grids are usually microfabricated by starting with a metal/insulator/metal film, and then etching apertures into the first two layers so that the bottom layer is exposed to vacuum. The top layer becomes the conductive grid and the bottom layer becomes the electrode. The insulator layer serves as a mechanical support for the grid. However, a drawback is that the maximum voltage in the conductive grid is limited due to the insulator's susceptibility to dielectric breakdown. Furthermore, because the insulator is in direct contact with the grid and the electrodes, under certain voltage bias, high leakage current may flow through the bulk of the insulator and/or on the exposed insulator surface. An example of an integrated grid is a Spindt tip array. See U.S. Pat. No. 3,755,704.

Referring to FIG. 1, an insulator layer 2 in a conventional integrated grid structure 1 may be disposed in the line of sight between a conductive grid 4 and an electrode 6 (such as, for example, an anode). In such conventional integrated grids, particles 8 (such as electrons, ions, gas molecules, adatoms, or the like) may impact the insulator layer 2. The impact of such particles 8 on the insulator layer 2 may lead to various issues such as without limitation leakage current, electrical shorting, contamination, dielectric breakdown, degradation, and/or corrosion.

SUMMARY

Disclosed embodiments include shadowed grid structures for electrodes in vacuum electronics and methods of fabricating integrated suspended grid structures for electrodes in vacuum electronics.

In a non-limiting embodiment, a vacuum electronics device includes: an electrode; a plurality of grid supports disposed on the electrode, each of the plurality of grid supports having a first width; and a plurality of grid lines, each of the plurality of grid lines being supported on an associated one of the plurality of grid supports, each of the plurality of grid lines having a second width that is wider than the first width.

In another non-limiting embodiment, a vacuum electronics device includes: a substrate having a plurality of pillars patterned therein; a plurality of first grid supports disposed on top of the plurality of pillars and having a first width; a plurality of first electrically conductive grids disposed on top of the plurality of first grid supports and having a second width that is wider than the first width; a plurality of second grid supports disposed on top of the plurality of first grids and having a third width; and a plurality of second electrically conductive grids disposed on top of the plurality of second grid supports and having a fourth width that is wider than the third width.

In another non-limiting embodiment, a vacuum electronics device includes: a conductive substrate having a plurality of pillars patterned therein; a plurality of first grid supports disposed on top of the plurality of pillars and having a first width; a plurality of first electrically conductive grids disposed on top of the plurality of first grid supports and having a second width that is wider than the first width; a plurality of second grid supports disposed on top of the plurality of first grids and having a third width; a plurality of second electrically conductive grids disposed on top of the plurality of second grid supports and having a fourth width that is wider than the third width; a plurality of third grid supports disposed on top of the plurality of second grids and having a fifth width; and a plurality of third electrically conductive grids disposed on top of the plurality of third grid supports and having a sixth width that is wider than the fifth width.

According to an aspect, the first grid is biased at a first positive voltage, the second grid is biased at a second positive voltage that is greater than the first voltage, and the third grid is biased at a third positive voltage that is less than the second voltage.

In another non-limiting embodiment, a method of fabricating a vacuum electronics device includes: providing an electrically conductive substrate; depositing a first film layer on the substrate; depositing a second film layer on the first film layer; defining a plurality of grid lines in the second layer; and selectively removing a portion of the first film layer underlying the plurality of grid lines to define a plurality of grid supports, each of the plurality of grid lines being supported on an associated one of the plurality of grid supports, each of the plurality of grid lines having a width that is wider than a width of each of the plurality of grid supports.

The foregoing is a summary and thus may contain simplifications, generalizations, inclusions, and/or omissions of detail; consequently, those skilled in the art will appreciate that the summary is illustrative only and is NOT intended to be in any way limiting. Other aspects, features, and advantages of the devices and/or processes and/or other subject matter described herein will become apparent in the text (e.g., claims and/or detailed description) and/or drawings of the present disclosure.

BRIEF DESCRIPTION OF THE FIGURES

Illustrative embodiments are illustrated in referenced figures of the drawings. It is intended that the embodiments and figures disclosed herein are to be considered illustrative rather than restrictive.

DETAILED DESCRIPTION

Figure 1:
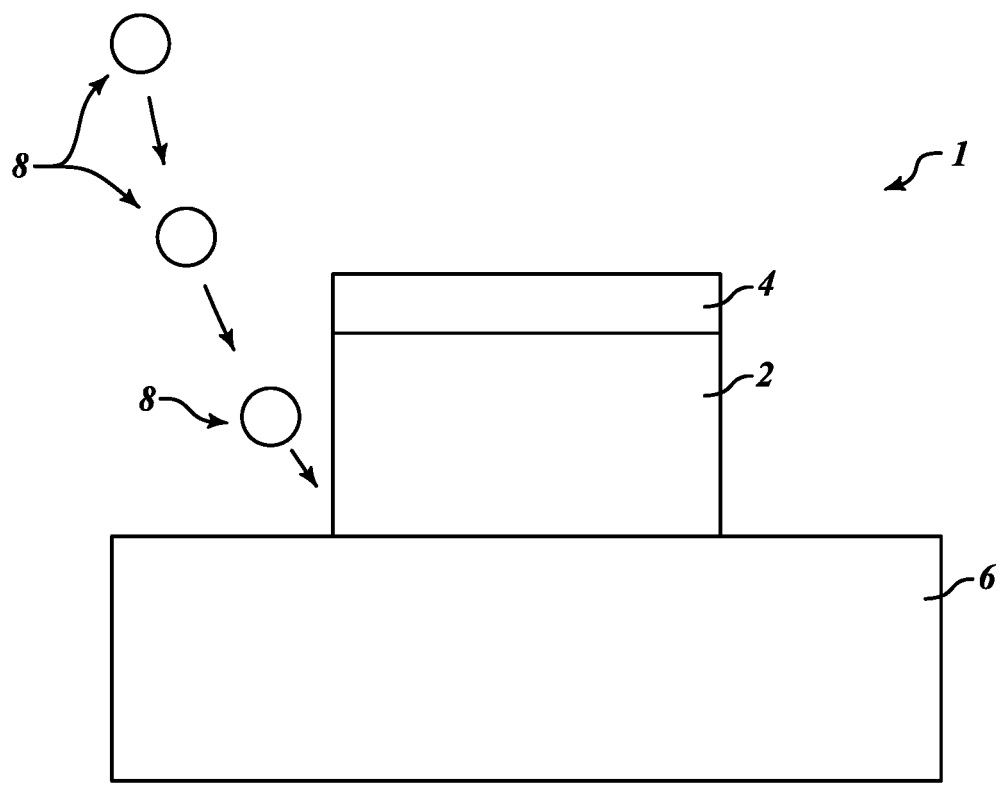
FIG. 1 is a cross-sectional view of a conventional integrated grid structure.

In the following detailed description, reference is made to the accompanying drawings, which form a part hereof. In the drawings, the use of the same symbols in different drawings typically indicates similar or identical items unless context dictates otherwise. The illustrative embodiments described in the detailed description, drawings, and claims are not meant to be limiting. Other embodiments may be utilized, and other changes may be made, without departing from the spirit or scope of the subject matter presented here.

Given by way of non-limiting overview, disclosed embodiments include grid structures for electrodes in vacuum electronics in which material that supports grid members on electrodes is not in the line of sight from particles. Such grid structures are referred to herein as "shadowed" grid structures.

Figure 2A:
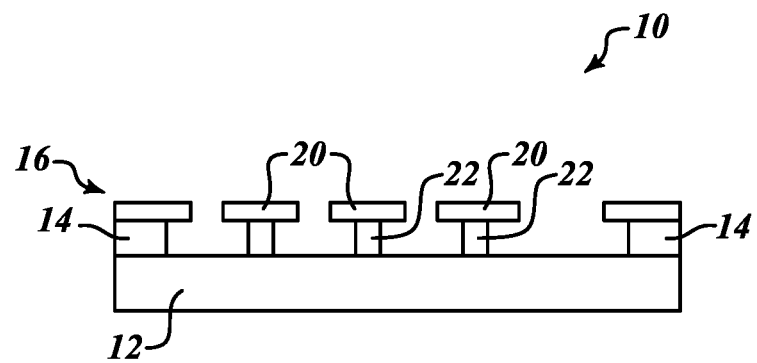
FIG. 2A is a cross-sectional view of an illustrative vacuum electronics device including a shadowed grid structure.
Figure 2B:
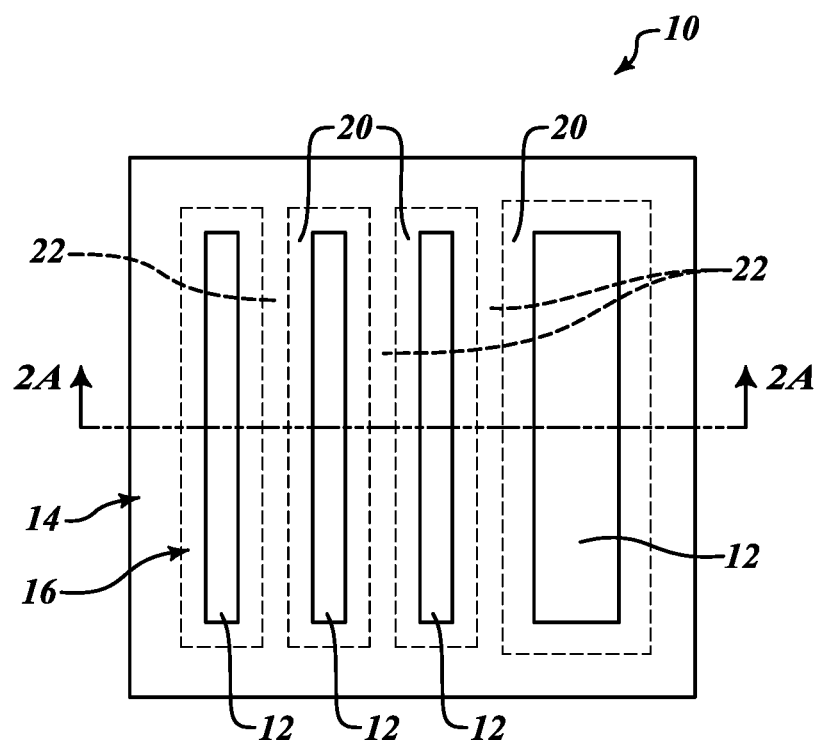
FIG. 2B is a top plan view of the shadowed grid structure of FIG. 2A.
Figure 2C:
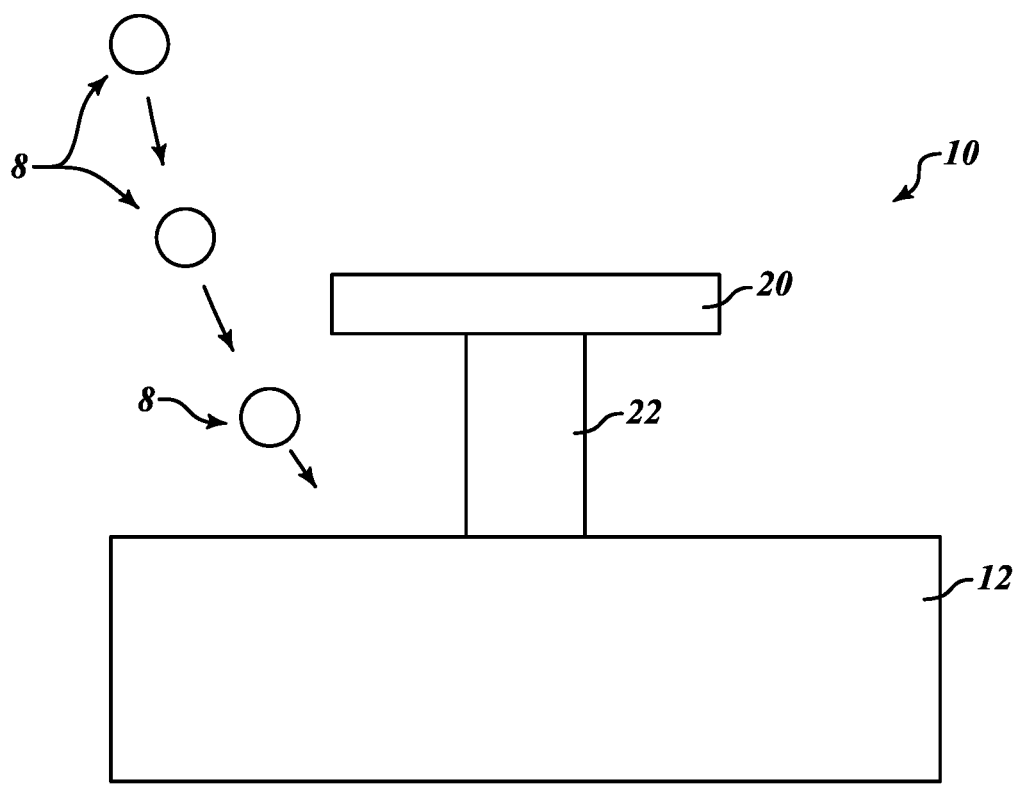
FIG. 2C is a cross-sectional view of details of the shadowed grid structure of FIG. 2A.

Still given by way of non-limiting overview and referring now to FIGS. 2A-2C, in an illustrative embodiment a vacuum electronics device 10 includes: an electrode 12; grid supports 22 disposed on the electrode 12, each grid support 22 having a first width; and grid lines 20, each of the grid lines 20 being supported on an associated grid support 22, each of the grid lines 20 having a second width that is wider than the first width. Thus, each grid support 22 is not disposed in the line of sight between its associated grid line 20 and the electrode 12. In other words, the grid support 22 is "shadowed" from the particles 8 (such as electrons, ions, gas molecules, atoms, or the like) as shown in FIG. 2C, thereby helping contribute to reducing the likelihood that the particles 8 may impact the grid support 22. By helping contribute to reducing the likelihood that the particles 8 may impact the grid support 22, disclosed embodiments may help contribute to reducing severity and/or likelihood of issues such as without limitation leakage current, electrical shorting, contamination, dielectric breakdown, degradation, and/or corrosion.

Continuing by way of overview, various disclosed embodiments pattern a multilayer film (such as a top film of a multilayer film stack) and selectively etch away or undercut the film and, in some embodiments, the substrate underneath (such as the bottom film of a multilayer film stack or the substrate underneath the film stack). In some of these embodiments, material in the film layer underneath the film layer that forms some or all of the grid lines 20 may be selectively etched—but not etched away completely—thereby creating the "shadowed" grid structure discussed above.

It will be appreciated that nano-scale devices and their fabrication processes may have an inherent nexus. For example, the choice of materials and fabrication steps for a device may take part in helping to define the device—just as the reverse may occur. It will also be appreciated that some of these choices may be brought about by issues regarding fabrication compatibility (for example and without limitation, using a doped semiconductor versus using a metal for a certain film).

It will be appreciated that disclosed embodiments are applicable to use of a grid that is closely separated from an electrode on any of the dielectric support structures disclosed herein or made by fabrication processes disclosed herein for vacuum electronics applications, including without limitation: thermionic devices, amplifiers, travelling wave tubes, klystrons, triodes, diodes, tetrodes, pentodes, mass spectrometers, residual gas analyzers, ion pumps, electron or ion or charged particle beam systems (such as electron microscopes, ion beams for milling, and the like), electrostatic or electromagnetic lenses, and other vacuum devices. It will also be appreciated that dielectric geometry may help to minimize surface and bulk dielectric leakage current and maximize dielectric breakdown strength between the grid and the electrode, so that different potentials may be applied to each.

Now that a non-limiting overview has been provided, illustrative details will be set forth below by way of non-limiting examples and not of limitation.

In various embodiments, the electrode 12 may be provided as an electrically conductive substrate which may include, by way of non-limiting examples, chromium, platinum, nickel, tungsten, molybdenum, niobium, tantalum, or other appropriate metals. In various embodiments the electrode 12 may be an anode in a vacuum electronics device, as desired for a particular application.

In various embodiments, the grid supports 22 may be patterned in a first film layer 14 that may include a dielectric, an electrical insulator, a ceramic, silicon oxide, silicon nitride, and and/or aluminum oxide. In various embodiments, the grid lines 20 may be patterned in a second film layer 16 that may include an electrical conductor, such as without limitation, chromium, platinum, nickel, tungsten, molybdenum, niobium, tantalum, or other appropriate metals. In some such embodiments, the electrical conductor may be disposed within an electrical insulator.

In some embodiments, the grid lines 20 may include a geometry such as, without limitation, a substantially straight line, a curved line, a circle array, a triangle array, and/or a hexagon array. Regardless of geometry, it will be appreciated that the non-limiting embodiment of FIGS. 2A and 2B may entail a gap between the grid lines 20 and the electrode 12 on the order of around a few hundred nanometers to a few micrometers or so.

Figure 2D:
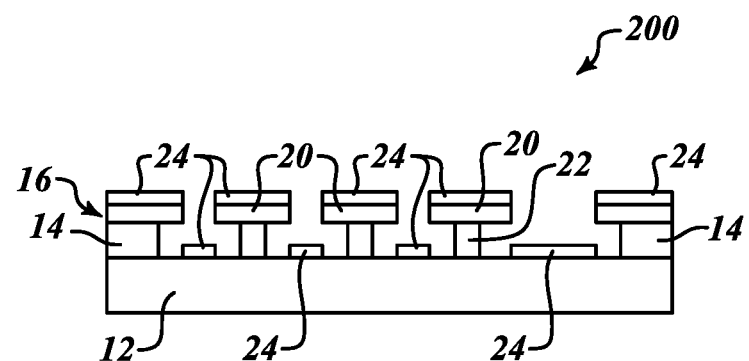
FIG. 2D is a cross-sectional view of another illustrative vacuum electronics device including a shadowed grid structure.
Figure 2E:
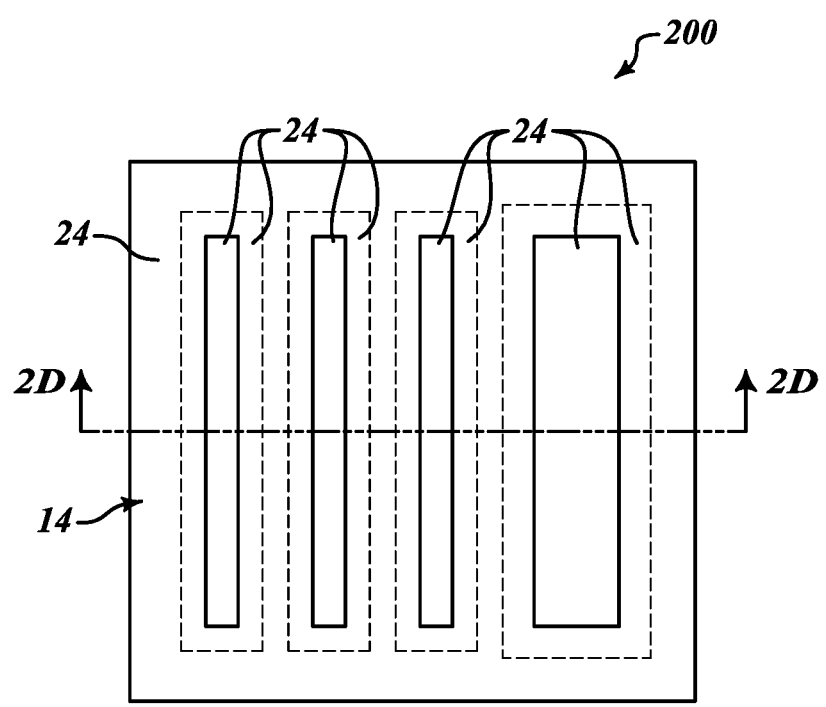
FIG. 2E is a top plan view of the shadowed grid structure of FIG. 2D.

Given by way of non-limiting example and as shown in FIGS. 2D and 2E, in various embodiments a vacuum electronics device 200 includes: the electrode 12; the grid supports 22 that are disposed on the electrode 12, each grid support 22 having a first width; the grid lines 20, each of the grid lines 20 being supported on an associated grid support 22, each of the grid lines 20 having a second width that is wider than the first width; and a layer of electrically conductive material 24 disposed on the grid lines 20. In some embodiments, a layer of the electrically conductive material 24 also may be disposed on the electrode 12.

In various embodiments, the conductive material 24 may include chromium, platinum, and/or the like, and the first film layer 14 may include silicon dioxide. In various embodiments, the second film layer 16 may include low-stressed material, such as without limitation silicon nitride, thereby helping to reduce associated stresses such that probability of cracking may be reduced when materials may be suspended from the second film layer 16. In some such embodiments, the conductive material 24 may serve as the conductive grid.

It will be appreciated that in some embodiments the electrically conductive material 24 disposed on the electrode 12 may be considered an artifact of deposition of the electrically conductive material 24 on the grid lines 20. However, the electrically conductive material 24 disposed on the electrode 12 may help prevent particle bombardment. Also, the electrically conductive material 24 disposed on the electrode 12 may help reduce the gap between the grid and the electrode 12, thereby helping to increase the electric field and, accordingly, helping to enable quantum tunneling and helping to increase efficiency. It will be further appreciated that the conductive material 24 may be evaporated on top after the grid supports 22 have been etched such that they are shadowed. It will be appreciated that the vacuum electronics device 200 may be suited for use in a field emission heat engine (which entails quantum tunneling).

Figure 2F:
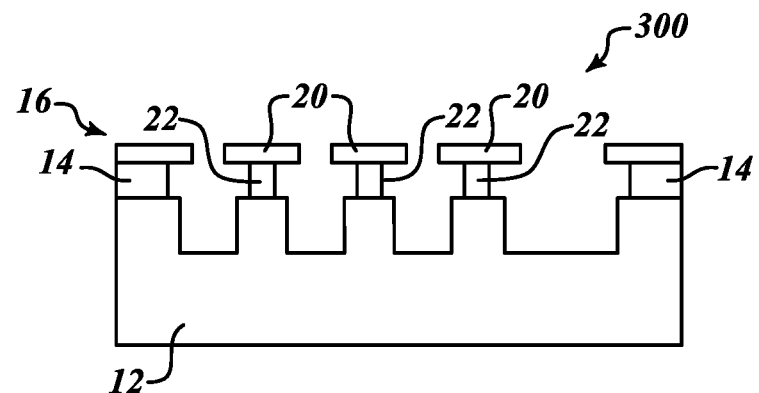
FIG. 2F is a cross-sectional view of another illustrative vacuum electronics device including a shadowed grid structure.
Figure 2G:
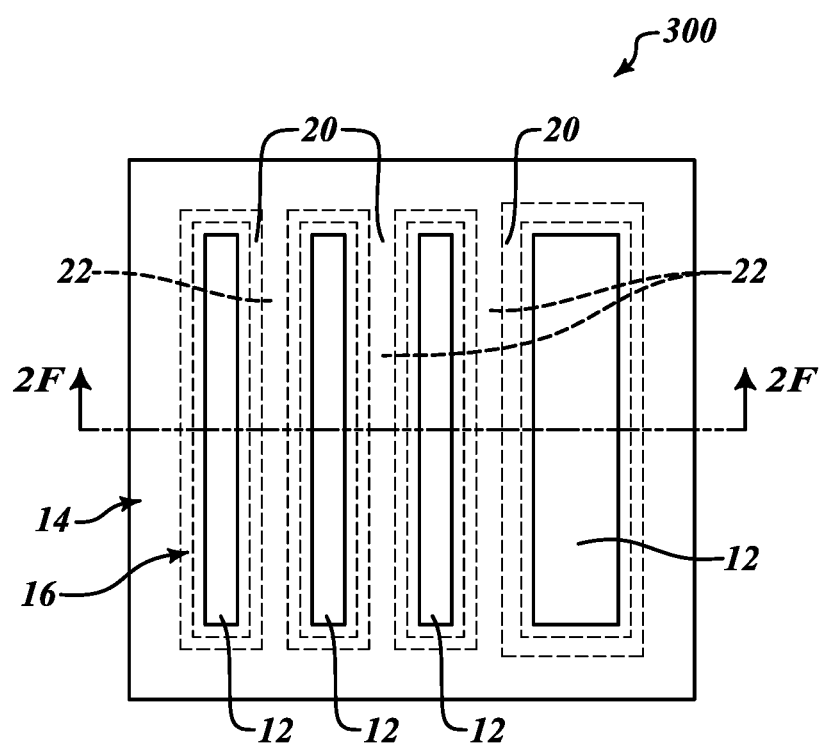
FIG. 2G is a top plan view of the shadowed grid structure of FIG. 2F.

Given by way of non-limiting example and as shown in FIGS. 2F and 2G, in various embodiments a vacuum electronics device 300 may have a grid structure that is further separated from the electrode 12 than are typical grid structures. In such embodiments, the vacuum electronics device 300 includes: the electrode 12; the grid supports 22 that are disposed on the electrode 12, each grid support 22 having a first width; the grid lines 20, each of the grid lines 20 being supported on an associated grid support 22, each of the grid lines 20 having a second width that is wider than the first width; wherein the substrate material underneath the first film layer 14 (that is, the electrode 12) can also be etched during the fabrication process. For instance, following the patterning of the first film layer 14 and the second film layer 16, the substrate underneath (that is, the electrode 12) can be further etched by wet or dry etching methods. As such, it will be appreciated that the vacuum electronics device 300 may have a grid structure that is separated further from the electrode 12 than are typical grid structures. To that end, in various embodiments of the vacuum electronics device 300, the gap between the grid lines 20 and the electrode 12 may be on the order of a few microns or tens of microns.

Various embodiments of the vacuum electronics device 300 may have a low fill factor (that is the ratio of area of the grid lines to the total area of the device) such as on the order of less than 2% or so. It will be appreciated that such a low fill factor can help to reduce grid loss (that is, electrons getting collected by the grid, thereby resulting in an I×V power loss) during operation. It will be appreciated that that I×V power loss is the product of the current through the grid at the voltage applied to the grid.

It will be appreciated that the vacuum electronics device 300 may be used in thermionic heat engines which do not entail quantum tunneling. Given by way of non-limiting example, the vacuum electronics device 300 may include a vacuum gap between the grid lines 20 and the electrode 12 and may have an applied voltage bias. In such a case, it will be appreciated that the resulting electric field may be on the order of between 0.5 mV/nm-1 mV/nm.

Illustrative fabrication techniques for fabrication various embodiments of vacuum electronics devices are discussed below by way of non-limiting examples.

Referring additionally to FIGS. 3A-3F, an illustrative method of fabricating a vacuum electronics device includes: providing an electrically conductive substrate; depositing a first film layer on the substrate; depositing a second film layer on the first film layer; defining a plurality of grid lines in the second layer; and selectively removing a portion of the first film layer underlying the plurality of grid lines to define a plurality of grid supports, each of the plurality of grid lines being supported on an associated one of the plurality of grid supports, each of the plurality of grid lines having a width that is wider than a width of each of the plurality of grid supports.

In some embodiments, the method may also include depositing at least one electrically conductive film layer on the plurality of grid lines. In some such embodiments, depositing at least one electrically conductive film layer on the plurality of grid lines may also include depositing at least one electrically conductive film layer on the substrate.

In various embodiments depositing a first film layer on the substrate and depositing a second film layer on the first film layer may be performed via a process such as chemical vapor deposition, physical vapor deposition, evaporation, sputtering, electroplating, or atomic layer deposition.

In some embodiments, defining a plurality of grid lines in the second layer may include: patterning the second film layer; and etching the second film layer and the first film layer. In some such embodiments, patterning the second film layer may be performed via a process such as lithography, photolithography, electron-beam lithography, block co-polymer lithography, nanosphere lithography, nanoimprint lithography, self-aligned double patterning, or double patterning. In some such embodiments, etching the second film layer and the first film layer may be performed via a process such as wet etching, dry etching, plasma etching, ion bombardment, reactive-ion etching, isotropic etching, and anisotropic etching.

In some embodiments, selectively removing a portion of the first film layer underlying the plurality of grid lines may include selectively etching the first film layer.

In some embodiments, the method may also include selectively etching at least one of the first film layer and the second film layer to a geometry chosen from a substantially straight line, a curved line, a circle array, a triangle array, and a hexagon array.

Figure 3A:
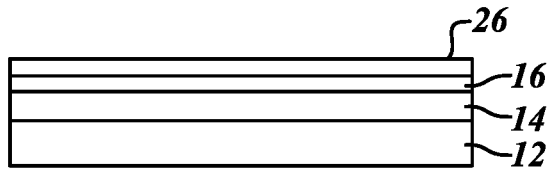
FIGS. 3A-3F illustrate a fabrication process of the vacuum electronics device of FIG. 2A.

In a non-limiting example given by way of illustration only, an illustrative method may be used to fabricate the vacuum electronics device 10. Such an illustrative method includes the following process steps:

As shown in FIG. 3A, the substrate 12 is spin coated with an image resist 26.

Figure 3B:
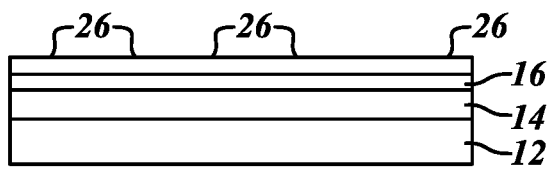

As shown in FIG. 3B, a sacrificial pattern is disposed on top of the second film layer 16 through standard lithography or exposure methods (for example, electron beam lithography, optical lithography, or imprinting lithography, block copolymer lithography, or the like).

Figure 3C:
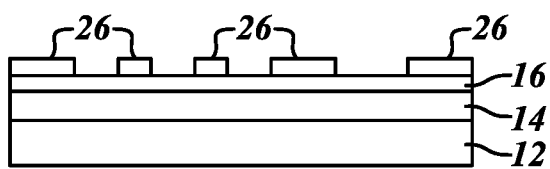

As shown in FIG. 3C, the resist 26 is used as a masking layer.

Figure 3D:
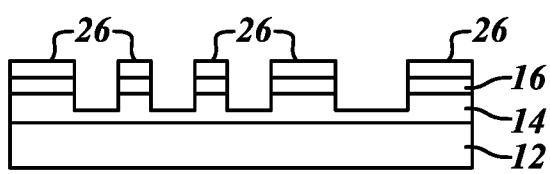

As shown in FIG. 3D, a selective etch into the second film layer 16 is performed to transfer the sacrificial pattern, and etching in the first film layer 14 is stopped at a predetermined point. As discussed above, the process may over-etch into the electrode 12 as desired for a particular application (See FIG. 2F).

Figure 3E:
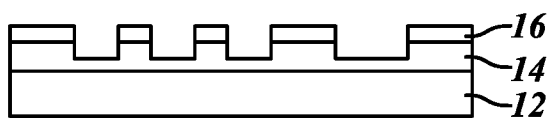

As shown in FIG. 3E, the resist is removed.

Figure 3F:
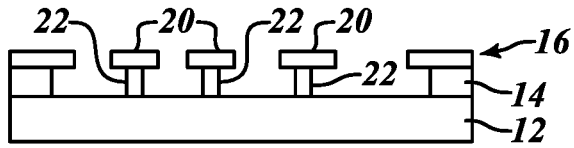

As shown in FIG. 3F, the first film layer 14 is selectively (that is, less-than-completely) undercut to pattern or define the grid supports 22 in the second film layer 16 for the grid lines 20 such that each of the plurality of grid lines 20 has a width that is wider than a width of each of the plurality of grid supports 22. In some embodiments, a metal film (or a multi-layer metal film stack) 24 may be deposited on the grid structure (not shown in FIGS. 6A-6F). See FIGS. 2D and 2E.

In an illustrative, non-limiting implementation of the process described above, a dielectric material such as a wet thermal oxide was used as the first film layer 14, a low-stressed dielectric material such as silicon nitride was used as the second film layer 16, and an i-line resist was used as the image resist 26. Exposure was carried out with an i-line stepper to create the grid pattern. The i-line resist was developed in a Tetramethylammonium Hydroxide (TMAH) developer. Etching of the first film layer 14 and the second film layer 16 was done with an Inductively Coupled Plasma Reactive Ion Etcher (ICP-RIE). Shadowing the grid line supports 22 was done in a wet chemical etch, which selectively etched the first film layer 14 without compromising the second film layer 16. Finally, in some embodiments the metal film 24 (FIGS. 2D and 2E) was deposited on top of the low-stressed dielectric grid to make the grid lines 20 conductive.

Referring additionally to FIGS. 4A-4F and 5A-5D, illustrative methods may be provided to fabricate vacuum electronics devices 400 (FIG. 4F) and 500 (FIG. 5E) which include non-co-planar grid structures. In various embodiments, the vacuum electronics devices 400 (FIG. 4F) and 500 (FIG. 5E) include: the electrode 12; a first grid 20A disposed above the electrode 12 in a first plane; and a second grid 20B disposed above the first grid 20A in a second plane that is not co-planar with the first plane.

Figure 4A:
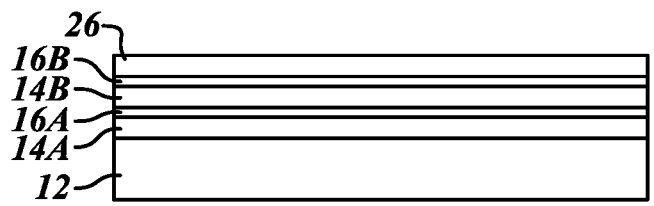
FIGS. 4A-4F illustrate a fabrication process of a non-co-planar shadowed grid structure.

As shown in FIG. 4A, two alternating dielectric materials are deposited sequentially over the electrode 12. That is, a first layer 14A of the first dielectric material is deposited on the electrode 12, a first layer 16A of the second dielectric material is deposited on the first layer 14A of the first dielectric material, a second layer 14B of the first dielectric material is deposited on the first layer 16A of the second dielectric material, and a second layer 16B of the second dielectric material is deposited on the second layer 14B of the first dielectric material. Resist 26 is deposited on the second layer 16B of the second dielectric material.

Figure 4B:
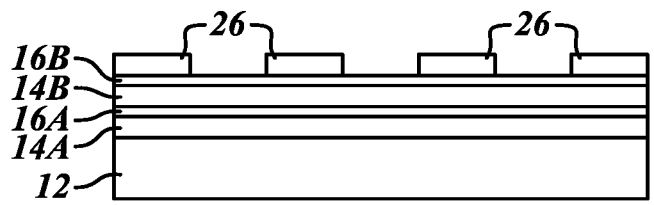
Figure 4C:
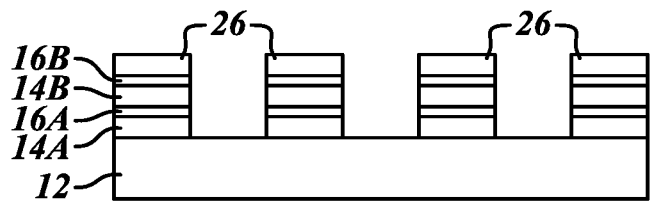
Figure 4D:
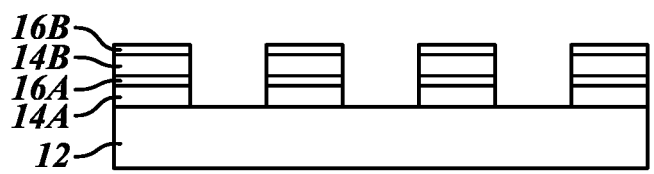

As shown in FIGS. 4B-4D, the first and second layers 14A, 14B and 16A, 16B of the first and second dielectric materials, respectively, are patterned.

Figure 4E:
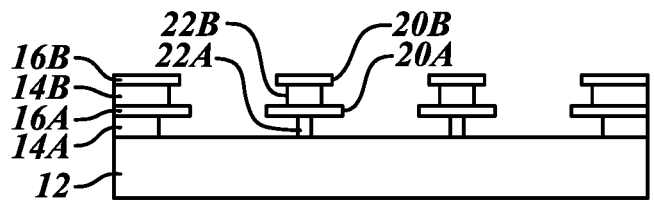

As shown in FIG. 4E, the first and second layers 14A and 14B of the first dielectric material are selectively undercut, thereby forming grid supports 22A and 22B that each have a width that is not as wide as their associated grid lines 20A and 20B, respectively.

Figure 4F:
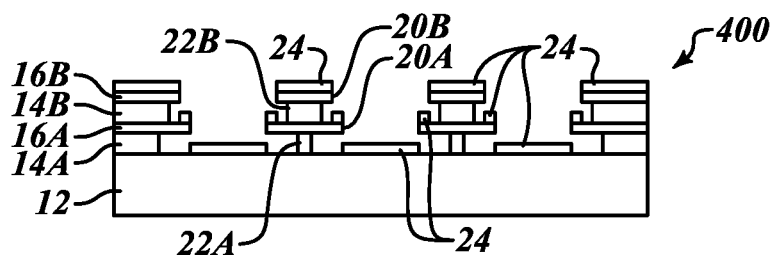

As shown in FIG. 4F, a metal layer 24 is deposited on the first and second layers 16A and 16B of the second dielectric material and the electrode 12. Because the grid lines are co-planar with the second layer 16B of the second dielectric material and with the first layer 16A of the second dielectric material, the grid lines are not co-planar with each other.

Figure 5A:
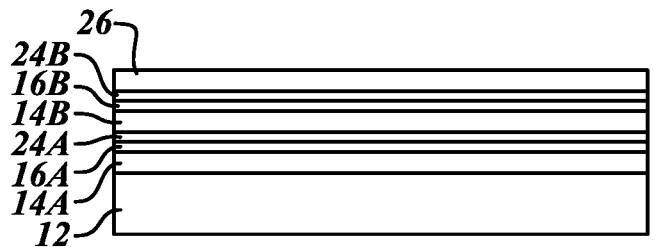
FIGS. 5A-5E illustrate a fabrication process of another non-co-planar shadowed grid structure.

As shown in FIG. 5A, two alternating dielectric materials and a metal layer are deposited sequentially over the electrode 12. That is, a first layer 14A of a first dielectric material is deposited on the electrode 12, a first layer 16A of a second dielectric material is deposited on the first layer 14A of the first dielectric material, a first layer 24A of a metal is deposited on the first layer 16A of the second dielectric material, a second layer 14B of the first dielectric material is deposited on the first layer 24A of the metal, a second layer 16B of the second dielectric material is deposited on the second layer 14B of the first dielectric material, and a second layer 24B of the metal is deposited on the second layer 16B of the second dielectric material. Resist 26 is deposited on the second layer 24B of the metal.

Figure 5B:
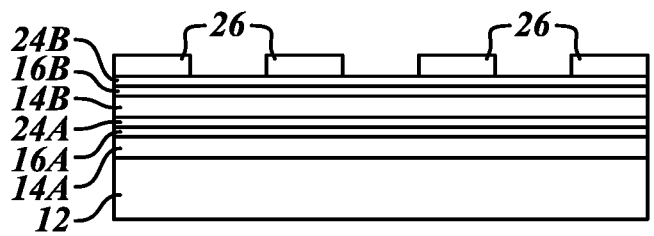
Figure 5C:
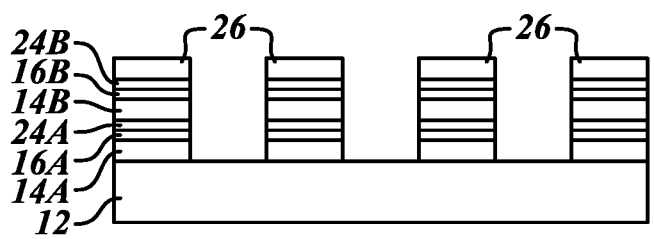
Figure 5D:
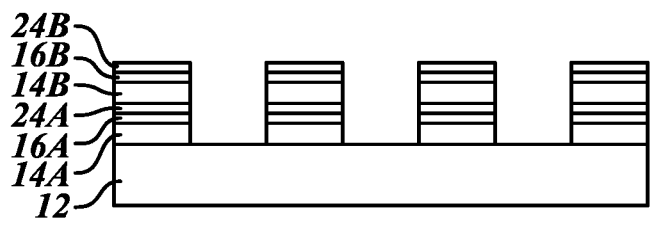

As shown in FIGS. 5B-5D, the first and second layers 14A, 16A, 24A and 14B, 16B, 24B of the first and second dielectric materials and the metal, respectively, are patterned.

Figure 5E:
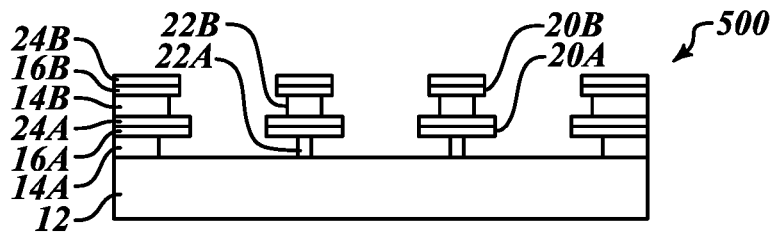

As shown in FIG. 5E, the first and second layers 14A and 14B of the first dielectric material are selectively undercut, thereby forming grid supports 22A and 22B that each have a width that is not as wide as their associated grid lines 20A and 20B, respectively. In the resulting non-co-planar grid structure, the second layer 24B of the metal on the second layer 16B of the second dielectric material forms grid lines and the first layer 24A of the metal on the first layer 16A of the second dielectric material forms grid lines. Because the grid lines are co-planar with the second layer 16B of the second dielectric material and with the first layer 16A of the second dielectric material, the grid lines are not co-planar with each other.

Illustrative applications of non-co-planar, shadowed grid structures will be set forth below by way of examples given by way of illustration only and not of limitation.

Illustrative Example No. 1 of Non-Co-Planar, Shadowed Grid Structure

A first illustrative application of a non-co-planar, shadowed grid structure is an electrostatically-protected grid in a vacuum electronic device.

In a standard thermionic diode, space charge (that is, an accumulation of electrons) builds up near the cathode (electron emitter) and prevents high current density across the diode, thereby limiting performance. In order to mitigate build-up of space charge, it is currently known to place an acceleration grid with a high positive voltage between the cathode and anode (electron collector), which pulls electrons away from the cathode to mitigate space charge. However, due to this high positive voltage, electrons are attracted to the acceleration grid itself, and so some electrons may hit the acceleration grid rather than the anode. This is called grid loss, and it expends energy and reduces device efficiency. Therefore, it is difficult to simultaneously improve the performance of the acceleration grid while keeping grid loss low. Similar considerations contribute to grid loss for acceleration grids in other vacuum electronics devices, for example ion thrustors, ion sources, and charged particle accelerators, with the change being that for positive charged particles, the polarity of the acceleration grid voltage is negative.

In addition to the mechanism described above, many electrons can impact high up on the sides of anode pillars. In these cases, grid loss can be exacerbated by inefficient absorption of electrons at the anode surface, and/or an accumulation of space charge at the anode surface.

Also, in microfabricated gridded devices, the anode and grid, or multiple grids, may be separated by a thin dielectric material. In such devices, shorting between the anode and grid (or between two grids) due to defects can present a serious concern.

In various non-limiting embodiments, a vacuum electronics device includes: a substrate having a plurality of pillars patterned therein; a plurality of first grid supports disposed on top of the plurality of pillars and having a first width; a plurality of first electrically conductive grids disposed on top of the plurality of first grid supports and having a second width that is wider than the first width; a plurality of second grid supports disposed on top of the plurality of first grids and having a third width; and a plurality of second electrically conductive grids disposed on top of the plurality of second grid supports and having a fourth width that is wider than the third width.

In various non-limiting embodiments, an auxiliary grid and an acceleration grid are provided to set up a dipole-like field in order to reduce the number of electrons impacting the acceleration grid. In such embodiments, a vacuum electronic device includes: at least one first grid; and at least one second grid, the second grid being electrically isolated from the first grid, the second grid having a voltage bias applied independently from the first grid, the second grid voltage bias and a geometry of the second grid being set such that an electric field between the first grid and the second grid reduces likelihood that charged particles strike the second grid.

In other non-limiting embodiments, a vacuum electronic device uses a narrow interpillar space between adjacent anode pillars. This narrow interpillar space focuses electrons halfway between the adjacent anode pillars, so that rather than impacting high up on the sides of the anode pillars, most electrons are directed down to the anode base. In such embodiments, a vacuum electronic device includes: an electrode; and a repeating pattern of high aspect ratio features disposed on the electrode.

In other non-limiting embodiments, a vacuum electronic device uses a cutout to enhance electrical isolation of two grids. In such embodiments, a vacuum electronic device includes at least two electrodes, wherein at least one of the electrodes defines at least one concave notch therein.

Given by way of non-limiting overview, in some embodiments the acceleration grid is highly exposed so that it is better able to accelerate charged particles (electrons or ions) across the vacuum gap (for example, to mitigate space charge), while charged particles are directed away from impacting the acceleration grid (to keep grid loss low). For example, in some such embodiments a multi-grid structure allows the acceleration grid to strongly mitigate space charge, but with electrostatic fields set up such that very few charged particles actually land on the acceleration grid, thus minimizing energy loss and improving overall device performance. Thus, an auxiliary grid and an acceleration grid set up a dipole-like field in order to reduce the number of charged particles impacting the acceleration grid. As a result, such embodiments can achieve higher current density and higher efficiency in a vacuum electronic device, such as a thermionic converter, an ion thruster, or an accelerator. In such embodiments, a vacuum electronic device includes: at least one first grid; and at least one second grid, the second grid being electrically isolated from the first grid, the second grid having a voltage bias applied independently from the first grid, the second grid voltage bias and a geometry of the second grid being set such that an electric field between the first grid and the second grid reduces likelihood that charged particles strike the second grid.

It will be appreciated that such embodiments may include several noteworthy features. Some of these noteworthy features include: a stacked grid structure that includes an auxiliary grid which can be positively biased yet still focus and collimate an electron beam (similarly, a stacked grid structure that includes an auxiliary grid which can be negatively biased yet still focus and collimate a positively-charged ion beam); application of a stacked electrostatic grid structure to a thermionic converter; a two-dimensional lensing system with translational symmetry along the length of a grid line; application of a "shadow grid" which does not physically shadow a downstream acceleration grid, and instead achieves a protective effect purely electrostatically by setting up a dipole potential structure; and application of a gridded thermionic converter which may, in some embodiments, deliberately dissipate power at a low-voltage auxiliary grid in order to significantly enhance overall power generation via the action of a much higher voltage acceleration grid.

It will also be appreciated that such features may help impart noteworthy characteristics. Some of these noteworthy characteristics include: an ability to achieve high efficiencies and power densities using flat or rectilinear electrodes, thereby helping to simplify the fabrication process for the thermionic converter and helping to increase the grid structure's robustness to process variability; no requirement for an external magnetic field to reduce grid loss, thereby circumventing technical challenges associated with stably maintaining strong magnetic fields at high operating temperatures of a thermionic converter; mitigation of power loss from electrons striking the exposed acceleration grid by leveraging the electrostatic focusing of the auxiliary grid; not electrostatically suppressing emission from a significant portion of the cathode area can allow more efficient use of the emitting surface area, thereby helping to improve power density and compactness of the converter; not requiring the auxiliary grid to physically shadow the acceleration grid in order to protect the acceleration grid from grid loss can help improve efficiency and power density of the device because exposed portions of the acceleration grid can much more effectively mitigate space charge accumulation within the vacuum gap (because the acceleration voltage is no longer screened by the auxiliary grid); by placing the electrostatic lensing system on the anode (electron collector) side of the converter, stability and leakage characteristics of the lensing system can be improved by operating the grids at much lower cold-side temperature of the thermionic converter; because embodiments do not rely on exposed dielectric surfaces for collimating the electron beam or protecting the acceleration grid, dielectric spacers can be undercut and hidden from the electron beam, thereby helping protect the device against performance losses due to dielectric charging; and by not relying on material properties of the grid (such as a high work function or high transmittance) for electrostatic focusing, embodiments are compatible with a wide range of grid materials and device lifetime can be increased by reducing sensitivity of the grids to cathode material evaporation.

In other embodiments, narrow interpillar space between adjacent anode pillars focuses electrons halfway between the adjacent anode pillars. Thus, rather than impacting high up on the sides of the anode pillars, most electrons are directed down to the anode base. As a result, grid loss can be reduced. In such embodiments, a vacuum electronic device includes: an electrode; and a repeating pattern of high aspect ratio features disposed on the electrode.

It will be appreciated that such embodiments may include noteworthy features, such as leveraging high aspect ratio anode pillars to simultaneously collimate an electron beam and avoid space charge accumulation on the anode surface.

In other embodiments, nearby grids are separated from each other to prevent shorting. In such embodiments, a curved section of the anode (or grid) is etched out next to the dielectric, thereby increasing the minimum distance between the anode and grid. Thus, a vacuum electronic device uses a cutout to enhance electrical isolation of two grids. In such embodiments, a vacuum electronic device includes at least two electrodes, wherein at least one of the electrodes defines at least one concave notch therein.

It will be appreciated that such embodiments may include noteworthy features, such as application of notched grid structures towards electrical isolation and improved defect tolerance of a gridded thermionic converter.

Now that a non-limiting overview has been provided, illustrative details will be set forth below by way of non-limiting examples and not of limitation. Structural details of disclosed embodiments will be explained first, followed by details regarding operation of disclosed embodiments, and followed by details of fabrication of disclosed embodiments.

Figure 6:
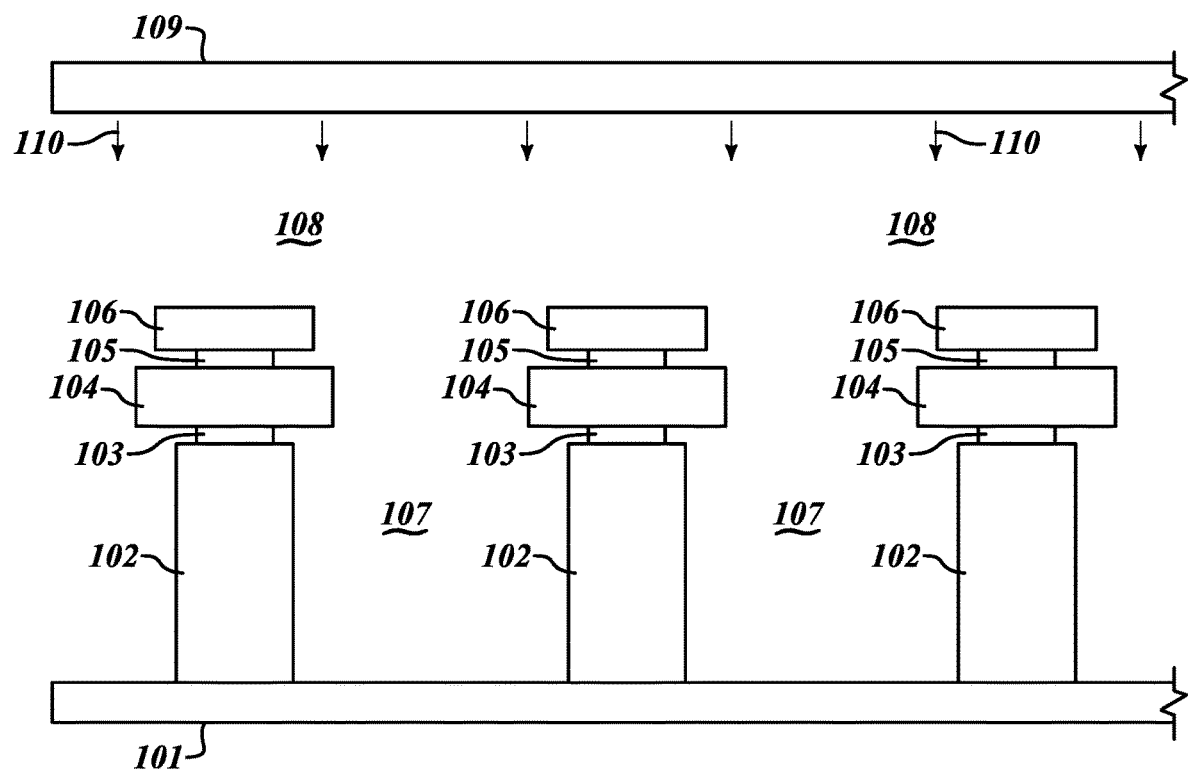
FIGS. 6 and 7 are cross section views of structure of an illustrative vacuum electronics device with an electrostatically protected grid.
Figure 7:
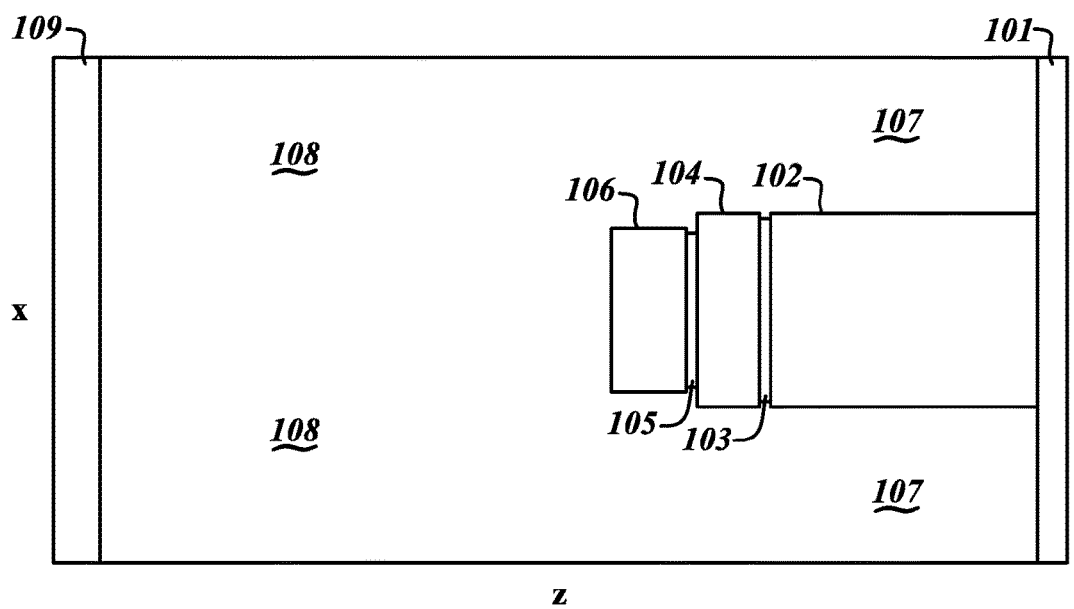
Figure 12A:
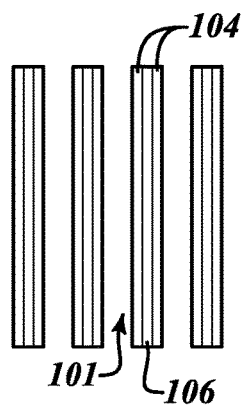
FIGS. 12A, 12B, and 12C are top plan views of layouts of various embodiments of illustrative vacuum electronics devices.

First, embodiments will be discussed in which an auxiliary grid and an acceleration grid are provided to set up a dipole-like field in order to reduce the number of electrons impacting the acceleration grid. Referring to FIGS. 6, 7, and 12A, illustrative, non-limiting embodiments of a vacuum electronics device include an anode base (substrate) 101, anode pillars 102 that lie on the anode base 101, an acceleration grid 104, and an auxiliary grid 106. The anode 101 and the grids 104 and 6 are separated by two objects, a lower separator (grid support) 103 between the anode pillar 102 and the acceleration grid 104, and an upper separator (grid support) 105 between the acceleration grid 104 and the auxiliary grid 106. The anode pillars 102, lower separators 3, acceleration grids 104, upper separators 5, and auxiliary grids 106 may repeat any number of times along one dimension of the anode base 101 and may extend in parallel lines along the other dimension parallel to the anode base 101. The negative space around the anode base 101, the anode pillar 102, the lower separator 103, the acceleration grid 104, the upper separator 105, and the auxiliary grid 106 and between the anode base 101 and a cathode 109 defines an interelectrode space 108. The portion of the interelectrode space 108 which lies between the anode pillars 102 defines an interpillar space 107. The interpillar space 107 and the interelectrode space 108 are partial vacuums, with gas pressures below 1 torr. In some instances, the interpillar space 107 and the interelectrode space 108 are filled with a low partial pressure of cesium and/or oxygen gas.

To that end and still referring to FIGS. 6, 7, and 12A, in such non-limiting embodiments a vacuum electronics device includes: the substrate 101 having a plurality of the pillars 102 patterned therein; a plurality of the first grid supports 103 disposed on top of the plurality of pillars 102 and having a first width; a plurality of first electrically conductive grids 104 disposed on top of the plurality of first grid supports 103 and having a second width that is wider than the first width; a plurality of second grid supports 105 disposed on top of the plurality of first grids 104 and having a third width; and a plurality of second electrically conductive grids 106 disposed on top of the plurality of second grid supports 105 and having a fourth width that is wider than the third width.

In various embodiments the anode base 101 and the anode pillar 102 are at the same voltage, which may be zero, positive, or negative. The acceleration grid 104 is set to a voltage that is more positive than the anode base 101 and the anode pillar 102. The auxiliary grid 106 is set to a voltage below that of the acceleration grid 104, which may be positive, negative, or zero, and may be greater or less than the anode voltage. The lower separator 103 and the upper separator 105 serve to electrically isolate and mechanically support the anode pillar 102, acceleration grid 104, and auxiliary grid 106.

Regarding geometry, the anode pillar 102, the lower separator 103, the acceleration grid 104, the upper separator 105, and the auxiliary grid 106 each have widths between 100 nm and 100 µm. In some embodiments, widths of the grids 104 and 106 and the separators 103 and 105 may be in a range from 0.5 µm to 5 µm. In some other embodiments, widths of the grids 104 and 106 and the separators 103 and 105 may be in a range from 5 µm to 50 µm. It will be appreciated that widths of the grids 104 and 106 and the separators 103 and 105 depend in part upon height of the pillar 102. This dependency is because aspect ratios (that is, height of the pillar 102 to width of the pillar 102) that are achievable with most semiconductor processing is less than 50:1. The width of the anode pillar 102 is typically narrower than the width of the acceleration grid 104, as shown, but may also be equal or slightly larger in width. The width of the auxiliary grid 106 is typically narrower than the width of the acceleration grid 104, but may also be equal or slightly larger in width. The width of the auxiliary grid 106 has no particular relationship with the width of the anode pillar 102. Instead, the purpose of the width of the auxiliary grid 106 is to form an optimal dipole field. The lower separator 103 and the upper separator 105 are typically narrower than the components they are in contact with, but they may be equal to or slightly larger than the components they are in contact width. It will be appreciated that when the lower separator 103 and the upper separator 105 are narrower than the components they are in contact with (that is, the grids 104 and 106, respectively) the lower separator 103 and the upper separator 105 are "shadowed." There is no particular relationship between the width of the lower separator 103 and the width of the upper separator 105. The heights of acceleration grid 104 and the auxiliary grid 106 are between 100 nm and 200 µm. In some embodiments the height of the lower separator 103 and the upper separator 105 may be between 10 nm and 50 µm. In various embodiments the height of the anode pillar 102 may be between 100 nm and 5 mm. In some embodiments the anode pillar 102 may have a height in a range from 10 µm to 100 µm. The anode base 101, the anode pillar 102, the lower separator 103, the acceleration grid 104, the upper separator 105, and the auxiliary grid 106 need not be rectangles as pictured; similar shapes or curved sides all produce similar effects.

As mentioned above, width of the auxiliary grid 106 typically is narrower than the width of the acceleration grid 104, but may also be equal or slightly larger in width. As a result, the auxiliary grid 106 deflects the electrons 110 away from the acceleration grid 104 due to its physical geometry and due to the dipole-like electric field created by its proximity to the acceleration grid 104. Such a configuration can help prevent the electrons 110 from being absorbed by the acceleration grid 104 while also mitigating space charge near the cathode 109 (due to reduced shielding of the acceleration grid 104 by the auxiliary grid 106.

The anode base 101, anode pillars 102, acceleration grid 104, and auxiliary grid 106 each may be metallic, semiconducting, or may include an insulating material with a metallic or semiconducting film or coating. They may be the same material, or each different materials. The lower separator 103 and the upper separator 105 may each be insulating, semiconducting, or include an insulating, metallic, or semiconducting material with an insulating or semiconducting film or coating. The lower separator 103 and the upper separator 105 may be the same material, or each a different material. The cathode 109 may be a solid electrode including: a metal or compound such as tungsten, rhenium, molybdenum, lanthanum hexaboride, or the like; an oxide-coated metal electrode such as an electrode coated with barium oxide, strontium oxide, calcium oxide, and/or scandium oxide or the like; or a metal matrix cathode impregnated with a low-work function material, such as barium oxide, strontium oxide, calcium oxide, and/or scandium oxide or the like.

The cathode 109 is heated to temperatures of at least several hundred degrees Celsius to induce thermionic or Schottky emission of electrons 110. The electrons 110 travel through the interelectrode space 108 toward the anode base 101, the anode pillar 102, the lower separator 103, the acceleration grid 104, the upper separator 105, and the auxiliary grid 106. The positive voltage on the acceleration grid 104 accelerates the electrons away from the cathode 109. Some of the electrons 110 impact the auxiliary grid 106, where they are likely to be absorbed. Other electrons 110 will be accelerated into the interpillar space 107, where they are largely focused around halfway between adjacent anode pillars 102, and impact either the anode base 101 or the anode pillars 102, where they are likely to be absorbed. Only a small fraction of the electrons 110 are absorbed by the acceleration grid 104, the lower separator 103, or the upper separator 105.

To that end, various aspects of such embodiments will be discussed below.

In various embodiments, a vacuum electronic device includes: at least one first grid; at least one second grid, the second grid being electrically isolated from the first grid, the second grid having a voltage bias applied independently from the first grid, and the second grid bias and geometry set such that the electric field between the first grid and second grid prevents or reduces a number of charged particles from striking the second grid. The at least one first grid and the at least one second grid may be physically connected to each other. The biases on the grids may be configured to electrostatically focus and/or direct charged particles.

In some embodiments the biases on the grids may be configured to establish a dipole electric field. The biases on the grids may be configured to establish a dipole electric field that prevents charged particles from striking the second grid.

In some embodiments the at least one first grid and the at least one second grid may be physically connected to each other via an associated one of a plurality of electrically insulating supports. The electrically insulating supports may be made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, and/or scandium oxide.

In some other of such embodiments the at least one first grid and the at least one second grid may be physically disconnected from each other.

In some embodiments the at least one first grid and the at least one second grid may be physically connected to an electrode. In some embodiments the at least one first grid and the at least one second grid may be physically connected to an electrode via an associated one of a plurality of electrically insulating supports. The plurality of electrically insulating supports may be made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, and/or scandium oxide.

In some embodiments the first grid has voltage bias from negative ten to positive ten volts. In some embodiments the second grid has voltage bias from negative one hundred to positive one hundred volts.

In some embodiments the first grid includes one or more of silicon, tungsten, molybdenum, nickel, lanthanum, boron, lanthanum hexaboride, barium, niobium, tantalum, and/or rhenium. In some embodiments the first grid includes one of a metal, a semiconductor, and an insulating material including one of a metallic coating and a semiconducting coating.

In some embodiments the second grid includes one or more of silicon, tungsten, molybdenum, nickel, lanthanum, boron, lanthanum hexaboride, barium, niobium, tantalum, and/or rhenium. In some embodiments the second grid includes one of a metal, a semiconductor, and an insulating material including one of a metallic coating and a semiconducting coating.

In some embodiments the electrode includes one of a metallic substrate, a semiconducting substrate, and an insulating substrate with one of a metallic coating and a semiconducting coating. In some such embodiments, the electrode operates as an anode.

In various embodiments the widths of the grids is between 500 nanometers and 30 microns.

In various embodiments the device is fabricated via reactive ion etching. In various embodiments the grids and the separators may be deposited via a process such as chemical vapor deposition, physical vapor deposition, evaporation, sputtering, electroplating, or atomic layer deposition.

In various embodiments the grid system is configured to generate electrical power. In various embodiments the grid system is configured to generate electrical power via thermionic energy generation.

In various embodiments the grid voltages may be optimized to generate the maximum possible amount of electrical power. In various embodiments the grid voltages may be optimized and tuned in time to generate the maximum possible amount of electrical power. In various embodiments the grid voltages may be optimized to generate electrical power at the maximum possible efficiency. In various embodiments the grid voltages may be optimized and tuned in time to generate power at the maximum possible efficiency.

In various embodiments the grids may be disposed in front of a cathode.

In various embodiments the voltage of the first grid is configured to minimize power consumption when the first grid is struck by charged particles.

In various embodiments the electrode is coated with one or more of barium, cesium, scandium, lanthanum, cerium, cerium hexaboride, lanthanum hexaboride, cesium oxide, barium oxide, and/or cesium fluoride.

In various embodiments the first grid is positively biased. In various embodiments the second grid is positively biased. In various embodiments the first grid is biased to optimally focus and collimate a beam of charged particles.

In various embodiments the device has an aspect ratio ranging from 5:1 to 100:1. In various embodiments the device has an aspect ratio ranging from 1:5 to 1:100. In various embodiments the first grid has an aspect ratio ranging from 5:1 to 100:1. In various embodiments the first grid has an aspect ratio ranging from 1:5 to 1:100. In various embodiments the second grid has an aspect ratio ranging from 5:1 to 100:1. In various embodiments the second grid has an aspect ratio ranging from 1:5 to 1:100. In various embodiments width of the second grid exceeds the width of the first grid.

Next, embodiments will be discussed in which narrow interpillar space between adjacent anode pillars focuses electrons halfway between the adjacent anode pillars. In such embodiments and as shown in FIG. 6, a vacuum electronic device includes an electrode (such as the anode base 101) and a repeating pattern of high aspect ratio features that are disposed on the electrode. The high aspect ratio features include the anode pillars 102, lower separators 3, acceleration grids 104, upper separators 5, and auxiliary grids 106. As discussed above, the anode pillars 102, lower separators 3, acceleration grids 104, upper separators 5, and auxiliary grids 106 may repeat any number of times along one dimension of the anode base 101 and may extend in parallel lines along the other dimension parallel to the anode base 101. That is, the repeating of the structure formed by the anode pillars 102, lower separators 3, acceleration grids 104, upper separators 5, and auxiliary grids 106 forms a narrow repeating period, which focuses electrons halfway between the anode pillars 102 and down to the anode base 101.

To that end, various aspects of such embodiments will be discussed below.

In various embodiments, a vacuum electronic device includes: an electrode; and a repeating pattern of high aspect ratio features disposed on the electrode.

In various embodiments, the pitch between the features ranges from 1 to 10 microns. In various embodiments, the pitch between the features ranges from 10 to 50 microns. In various embodiments, the pitch between the features ranges from 50 to 100 microns.

In various embodiments, the features include one or more electrically isolated grids. In various embodiments, the features include one or more insulating supports. In various embodiments, the features include one or more grids that are electrically isolated from each other by one or more insulating supports.

In various embodiments, the features are made from materials chosen from one or more of silicon, nickel, silicon oxide, silicon dioxide, silicon nitride, aluminum oxide, aluminum nitride, magnesium oxide, lanthanum oxide, yttrium oxide, hafnium oxide, zirconium oxide, and/or scandium oxide. In various embodiments, the features are made from materials chosen from one or more of silicon, tungsten, molybdenum, nickel, lanthanum, boron, lanthanum hexaboride, barium, niobium, tantalum, rhenium, nickel, silicon oxide, silicon dioxide, silicon nitride, aluminum oxide, aluminum nitride, magnesium oxide, lanthanum oxide, yttrium oxide, hafnium oxide, zirconium oxide, and/or scandium oxide.

In various embodiments, the features include one of a metal, a semiconductor, and an insulating material including one of a metallic coating and a semiconducting coating.

In various embodiments, the aspect ratio of the features ranges from 2:1 to 5:1. In various embodiments, the aspect ratio of the features ranges from 5:1 to 10:1. In various embodiments, the aspect ratio of the features ranges from 10:1 to 50:1.

In various embodiments, the features are formed via reactive ion etching. In various embodiments the grids and the separators may be deposited via a process such as chemical vapor deposition, physical vapor deposition, evaporation, sputtering, electroplating, or atomic layer deposition.

In various embodiments, the electrode operates as an anode.

In various embodiments, the widths of the features is between 500 nanometers and 30 microns.

In various embodiments, the electrode and the features are disposed in front of a cathode.

In various embodiments, the features are configured to generate electrical power. In various embodiments, the features are configured to generate electrical power via thermionic energy generation.

In various embodiments, the grid voltages are optimized to generate the maximum possible amount of electrical power. In various embodiments, the grid voltages are optimized and tuned in time to generate the maximum possible amount of electrical power. In various embodiments, the grid voltages are optimized to generate electrical power at the maximum possible efficiency. In various embodiments, the grid voltages are optimized and tuned in time to generate power at the maximum possible efficiency.

In various embodiments, the grid voltages are optimized to collimate a beam of charged particles. In various embodiments, the grid voltages are optimized and tuned in time to collimate a beam of charged particles.

Figure 8:
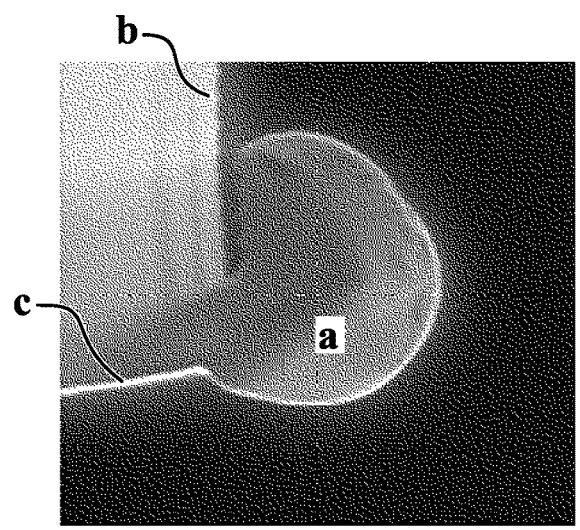
FIGS. 8 and 9 are scanning electron microscope images of illustrative cutouts.

Next, embodiments will be discussed in which nearby grids are separated from each other to prevent shorting. In such embodiments, a curved section of the anode (or grid) is etched out next to the dielectric, thereby increasing the minimum distance between the anode and grid. Thus, a vacuum electronic device uses a cutout to enhance electrical isolation of two grids. In such embodiments, a vacuum electronic device includes at least two electrodes, wherein at least one of the electrodes defines at least one concave notch therein. Referring additionally to FIG. 8, a cutout a (that is, a concave notch) is formed between the sidewall of the auxiliary grid b (reference number 6 as shown in FIGS. 6 and 7) and the top of the acceleration grid c (reference number 104 as shown in FIGS. 6 and 7). In various embodiments, an isotropic etch can etch into the corner between a lower silicon surface (that will become the top of the acceleration grid c) and auxiliary grid wall, thereby forming the cutout a. At this point or later, an oxide or other insulating layer can be grown or deposited, and the cutout a can then serve as the upper separator 105 (FIGS. 6 and 7). It will be appreciated that these cutout features can also be used to serve as a physical means of separating the auxiliary grid b from the acceleration grid c in a process where the two grids are formed in a single metallization step, without any other means, such as masking, to separate the two grids.

Figure 9:
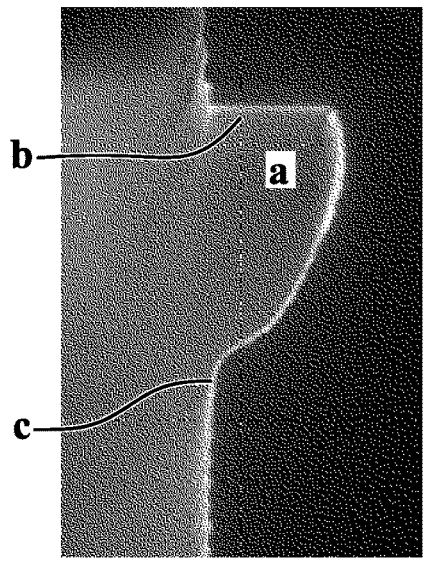

Referring additionally to FIG. 9, another cutout a is formed between the bottom of the lower separator b (reference number 3 in FIGS. 6 and 7) and the top of the anode pillar c (reference number 102 in FIGS. 6 and 7). For example, during or after etching a handle to form the anode pillar 102, a longer etch can be applied specifically to create the cutout a (FIG. 9) at the top corners of the anode pillar c (FIG. 9), where the anode pillar c (FIG. 9 contacts the lower separator b (FIG. 9). This cutout a (FIG. 9) increases the minimum surface pathlength between the acceleration grid 104 and the anode pillar 102, which decreases the opportunity for an electrical short to develop between the acceleration grid 104 and the anode pillar 102. This is especially useful in preventing surface breakdowns, such as electrical breakdowns along the surface of the lower separator b (FIG. 9).

To that end, various aspects of such embodiments will be discussed below.

In various embodiments, a vacuum electronic device includes: at least two electrodes wherein one or more of the electrodes feature at least one concave notch in their cross-sectional geometries.

In various embodiments, the at least two electrodes are physically connected to each other. In various embodiments, the at least two electrodes are physically connected to each other via an associated one of a plurality of electrically insulating supports. In various embodiments, the plurality of electrically insulating supports are made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, and/or scandium oxide.

In various embodiments, the at least two electrodes are physically disconnected from each other.

In various embodiments, the at least two electrodes are physically connected to an electrode. In various embodiments, the at least two electrodes are physically connected to an electrode via an associated one of a plurality of electrically insulating supports. In various embodiments, the plurality of electrically insulating supports are made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, and/ or scandium oxide.

In various embodiments, one electrode has a voltage bias from negative ten to positive ten volts. In various embodiments, one electrode has a voltage bias from negative one hundred to positive one hundred volts.

In various embodiments, at least one electrode operates as an anode.

In various embodiments, the at least two electrodes are comprised of one or more of silicon, tungsten, molybdenum, nickel, lanthanum, boron, lanthanum hexaboride, barium, niobium, tantalum, and/or rhenium. In various embodiments, the at least two electrodes include one of a metal, a semiconductor, and an insulating material including one of a metallic coating and a semiconducting coating. In various embodiments, the electrode includes one of a metallic substrate, a semiconducting substrate, and an insulating substrate with one of a metallic coating and a semiconducting coating. In various embodiments, the electrode operates as an anode.

In various embodiments, widths of the grids is between 500 nanometers and 30 microns.

In various embodiments, the device is fabricated via reactive ion etching. In various embodiments the grids and the separators may be deposited via a process such as chemical vapor deposition, physical vapor deposition, evaporation, sputtering, electroplating, or atomic layer deposition.

In various embodiments, the concave notches are configured so as to minimize electrical shorting between the grids. In various embodiments, the concave notches are configured so as to maximize the surface pathlength between the grids.

In various embodiments, at least one of the plurality of electrically insulating supports is configured to minimize electrical shorting between the grids. In various embodiments, at least one of the plurality of electrically insulating supports is configured to maximize the surface pathlength between the grids.

In various embodiments, the grids are disposed in front of a cathode.

In various embodiments, the notch has radius of curvature between 50 nanometers and 30 microns. In various embodiments, the notch is formed via reactive ion etching.

Various embodiments operate as follows.

In various embodiments and referring to FIGS. 6, 7, 10, and 11, devices function as a converter of heat into electricity. Heat may be introduced through any arbitrary method, including but not limited to burning hydrocarbons, using solar-thermal heating, or heating using a nuclear reaction. Illustrative devices function by applying this heat, either directly or through a method of thermal transfer, to the cathode 109 so that the cathode 109 emits electrons. The anode base 101 and the anode pillar 102 are kept cooler than the cathode 109 and have a lower work function than the cathode 109. As a result, when an electron is absorbed by the anode base 101, electricity can be generated (the basis of all thermionic converters).

To operate the device, voltages are applied to the acceleration grid 104 and the auxiliary grid 106, as well as optionally to the anode base 101 and anode pillar 102. Examples of these voltages include a voltage of 5 V to 100 V on the acceleration grid 104, −2 V to 10 V on the auxiliary grid 106, and −1 V to 2 V on the anode base 101 and anode pillar 102. The voltages applied to the acceleration grid 104 and the auxiliary grid 106 generate an electric field in the interelectrode space 108 near the cathode 109, which mitigates space charge (that is, an accumulation of electrons) near the cathode surface, which increases the performance of the device, for example in terms of efficiency or current density obtained. These voltages, as well as the geometry of the acceleration grid 104 and the auxiliary grid 106, are additionally configured so that very few electrons 110 impact and are absorbed by the acceleration grid 104. This configuration further improves the efficiency and current density obtained through operation of the device.

To explain the operation of the acceleration grid 104 and the auxiliary grid 106 in detail, consider an electron inside the cathode 109. The application of heat may result in the ejection of this electron from the cathode surface. Once an electron has been emitted by the cathode 109, the positive voltage applied to the acceleration grid 104 accelerates the electron 110 away from the cathode 109. Electrons 110 with the appropriate speed and direction of travel impact the auxiliary grid 106, where they are likely to be absorbed. Depending on the voltage of the auxiliary grid 106, these electrons 110 may produce a small amount of electricity, may have no effect on electricity production, or may consume a small amount of electricity.

Figure 10:
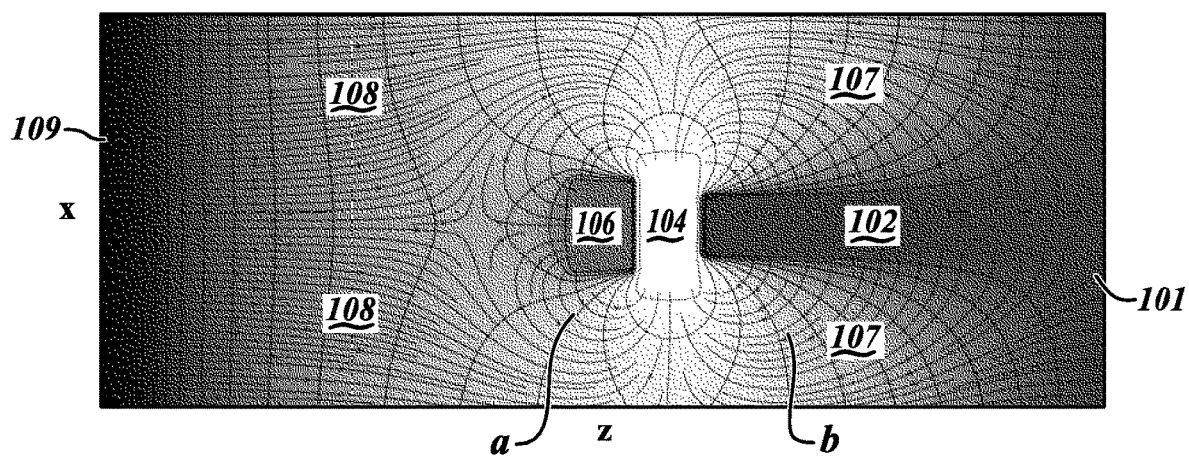
FIG. 10 illustrates calculated electric potential.

Thus, FIG. 10 shows calculated electric potential from minimum to maximum, electric field streamlines, and electric field contour lines. A dipole-like field a (FIG. 10) between the auxiliary grid 106 and the acceleration grid 104, as well as dipole-like field b (FIG. 10) between the acceleration grid 104 and the anode pillar 102, can be seen.

Figure 11:
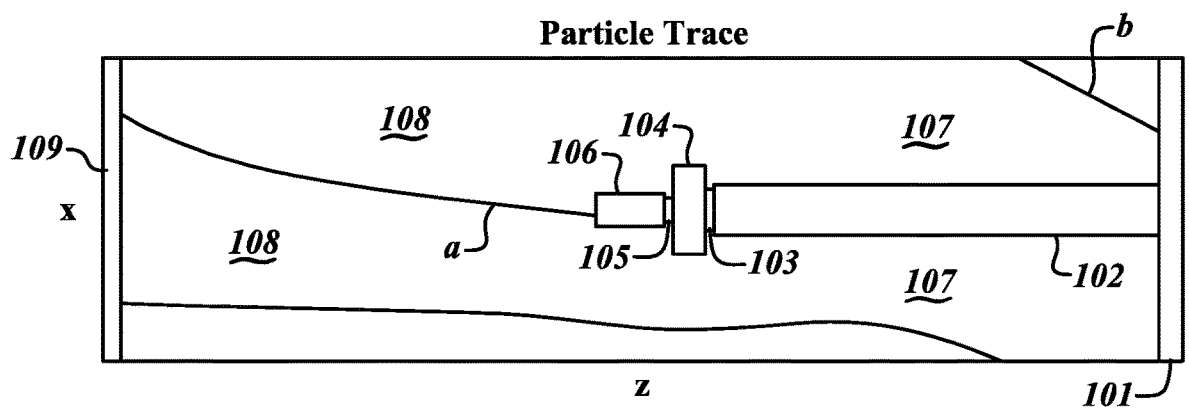
FIG. 11 illustrates line traces of two particles following described trajectories.

FIG. 11 shows line traces (from simulation) of two particles following described trajectories. The particle a (FIG. 11) impacts the auxiliary grid 106. The particle b (FIG. 11) impacts the anode base 101, and the horizontal deflections described below can be seen. Note that the figure is periodic, so that the particle b (FIG. 11) moves from the bottom to the top of FIG. 11 near the right edge of FIG. 11.

Electrons 110 that travel toward the anode base 101, the anode pillar 102, the lower separator 103, the acceleration grid 104, the upper separator 105, and the auxiliary grid 106 but do not impact the auxiliary grid 106 enter the interpillar space 107. As these electrons 110 travel toward the anode base 101, the anode pillar 102, the lower separator 103, the acceleration grid 104, the upper separator 105, and the auxiliary grid 106, the acceleration grid 104 continues to accelerate the electrons 110 away from the cathode 109. As an electron 110 moves near the auxiliary grid 106, the electric field around the electron 110 is curved by a dipole-like effect generated by the relative voltages of the acceleration grid 104 and the auxiliary grid 106, which are in close proximity to each other. The electron 110 is initially deflected horizontally away from the auxiliary grid 106 it is closest to. Then, as the electron 110 nears its closest approach to the acceleration grid 104, the electron 110 is deflected horizontally towards the acceleration grid 106. Finally, as the electron 110 moves further toward the anode base 101 away from the acceleration grid 104, the electron 110 is again deflected horizontally away from the nearest acceleration grid 104, this time due to the dipole-like effect generated by the relative voltages of the acceleration grid 104 and the anode pillar 102, which are in close proximity to each other.

Regarding embodiments in which narrow interpillar space focuses electrons halfway between the adjacent anode pillars (so that rather than impacting high up on the sides of the anode pillars, most electrons are directed down to the anode base), this dipole-like field and deflection can be enhanced by using the narrow interpillar space 107, thereby causing most of the electrons 110 to travel much farther towards the anode base 101 than they would without these deflections. As a result of these deflections, most of these electrons 110 will impact either the anode base 101 or anode pillar 102, where they are likely to be absorbed. The voltages on the anode base 101, the anode pillar 102, the acceleration grid 104, and the auxiliary grid 106 can be varied to optimize the likelihood of this absorption. A small number of the electrons 110 are not absorbed by the anode base 101 or the anode pillar 102. These remaining electrons 110 will, in general, begin to move towards the cathode 109. Due to the electric fields generated by the anode base 101, anode pillar 102, acceleration grid 104, auxiliary grid 106, and cathode 109, the remaining electrons 110 may ultimately be absorbed by any one of the anode base 101, the anode pillar 102, the lower separator 103, the acceleration grid 104, the upper separator 105, the auxiliary grid 106 or the cathode 109. As noted above, all of the electrons 110 that are absorbed by the anode base 101 or the anode pillar 102 lead to electricity generation.

It will be appreciated that voltages, as well as temperature of the cathode 109, can be varied to change and optimize performance of the device. In particular, the voltages can be varied in time to adjust for changing conditions in device operation (e.g. the heat flux into the device varying with time, or the cathode-to-auxiliary grid distance varying in time, etc.) The voltages can also be varied between different units (where each unit is a set of the anode pillar 102, the lower separator 103, the acceleration grid 104, the upper separator 105, and the auxiliary grid 106). That is, for a device with many units spanning across the anode base 101, the voltages of the acceleration grid 104 and/or the auxiliary grid 106 in each unit can be different, to adjust for changing conditions between different parts of the device. For example, the distance between the cathode 109 and the auxiliary grid 104 may vary spatially.

Furthermore, voltages and the cathode temperature can be varied to change the device output or mode of operation. For example, voltages could be varied to switch between a mode of operation that maximizes power output and a mode of operation that maximizes device efficiency. Voltages and the cathode temperature could also be varied in response to the user's demand for power from the device.

Voltages and cathode temperature could also be varied in order to measure and quantify device performance. In this configuration, the response of the device to the change is measured, and this response is used to determine optimal parameters for device operation.

As discussed above, in disclosed embodiments electrical fields are used to generally steer the electrons 110 in the interpillar space 107 away from sides of the anode pillar 102 and towards the anode base 101. It will be appreciated that, by steering electrons toward the region halfway between adjacent anode pillars 102, the electrons 110 have a large region in which they can be absorbed by the anode base 101 or low down on the anode pillars 102, and space charge buildup is minimal. Without this steering effect, many of the electrons 110 may strike high up on the anode pillars 102 near the acceleration grid 104. In such cases, space charge would build up, and ultimately many of the electrons would impact the acceleration grid 104. However, the steering effect provided by disclosed embodiments helps prevent the electrons 110 from striking high up on the anode pillars 102 near the acceleration grid 104 and helps mitigate space charge from building up, and ultimately helps prevent many of the electrons 110 from impacting the acceleration grid 104. Thus, this focusing feature can provide flexibility in fabrication while still minimizing the number of the electrons 110 which can impact the acceleration grid 104.

It will be appreciated that many methods may be used to fabricate the gridded structures described above. One method uses a silicon-on-insulator substrate, where device layer (upper silicon) is used to create the auxiliary grid 106, acceleration grid 104, and upper separator 105, while a buried oxide layer is used as the lower separator 103 and a handle layer (lower silicon) is used to create the anode base 101 and anode pillar 102. The buried oxide becomes the lower separator 103 by providing electrical insulation between the anode pillar 102 and the acceleration grid 104.

First, photoresist can be used to pattern features on the surface in order to pattern the auxiliary grid 106. These grids can range from tens of nanometers to tens of micrometers in widths, with lengths dependent on the size and spacing of the cathode 109. Then the device layer can be etched down to the top of the acceleration grid 104 using any number of appropriate silicon etches (such as deep silicon etching using switched $SF_6/C_4F_8$ processing, or a $SF_6/O_2$ mixed process at cryogenic temperatures, or any number of other silicon etches based on fluorocarbon gases or other fluorine containing gases).

At this point, in some embodiments a technique can be used electrically separate the auxiliary grid 106 and the acceleration grid 104. After protecting the lower silicon surface (which will become the top of the acceleration grid 104) and the walls of the auxiliary grid 106, an isotropic etch will etch into the corner between the lower silicon surface and wall of the auxiliary grid 106, thereby forming the cutout a (FIG. 8). At this point or later, an oxide or other insulating layer can be grown or deposited, and the cutout a can then serve as the upper separator 105.

After the cutout a has been formed, further photoresist can be used to pattern features of the acceleration grid 104, and again a silicon etch can be used to expose the acceleration grid 104. The buried oxide layer can then be etched using dry plasma etching with, for example, $CHF_3/O_2$ or $CF_4/O_2$ gases in a reactive ion etcher or an inductively coupled reactive ion etcher. Alternatively, a wet etch could be used to similar effect. Next the handle can be etched further, creating recesses that form the anode pillar 102 and the anode base 101.

Referring to FIG. 9, another cutout a is formed between the bottom of the lower separator b (reference number 103 in FIGS. 6 and 7) and the top of the anode pillar c (reference number 102 in FIGS. 6 and 7). For example, during or after etching the handle to form the anode pillar 102, a longer etch can be applied specifically to create the cutout a (FIG. 11) at the top corners of the anode pillar c (FIG. 11), where the anode pillar c (FIG. 11) contacts the lower separator b (FIG. 11). This cutout a (FIG. 11) increases the minimum distance between the acceleration grid 104 and the anode pillar 102, which decreases the opportunity for a short to develop between the acceleration grid 104 and the anode pillar 102.

A silicon etch can also be used to narrow the anode pillars 102 if desired. After appropriate cleaning, the oxide layer (which is now the lower separator 103) can be isotopically etched so that there is no electrical insulator exposed to the electrons 110. Next, optionally, a material could be deposited over the entire structure to protect structures from corrosive materials often used to lower the work function of metals, such as cesium or barium. This could be accomplished using atomic layer deposition or other appropriate deposition technique to get a conformal coating over the entire structure. Lastly, a suitable method can be used to deposit metal or other low work function material on the anode 101 or the grids 104 and 106 without shorting the grids 104 and 106 to the anode 101 or to each other.

A similar fabrication could be performed using different starting materials (that is, not a silicon-on-insulator wafer). For example, thermal oxide or other dielectric (for example, silicon nitride) can be deposited on a silicon wafer, and then highly doped polysilicon or other conductive material (for example, tungsten) can be deposited on the dielectric. Then the films can be etched back and processed in the method described above. Similarly, metal, then dielectric, then metal can be deposited to use as an initial substrate for patterning.

Another method is to start with a wafer that includes two layers of insulating material sandwiched between three layers of silicon or other semiconductor, or to deposit these layers as the first step of processing. The films can again be etched and processed in the method described above, but the top layer of buried insulating material can now serve as the upper separator 105, rather than relying on the etch to create a cutout described above.

Another method is to create structures by building from the bottom up. For example, a metal substrate could be used as a base to electroplate the anode pillar 102 onto, that could then be coated with dielectric to form the lower separator 103. Then a second pillar could be aligned to and electroplated on top of the first pillar, creating the acceleration grid 104, and again coated with dielectric to form the upper separator 105. Finally, a third pillar could be aligned to and electroplated on top of the second pillar to create the auxiliary grid 106. Additional etching steps could be performed in a similar manner as previous methods to create associated undercut structures.

It will be appreciated that additional embodiments of devices are contemplated.

For example, in some embodiments a device may be provided in which in which the anode pillar 102 and the lower separator 103 are removed, and the acceleration grid 104 and the auxiliary grid 106 are suspended above the anode base 101. The acceleration grid 104 and the auxiliary grid 106 may be mechanically connected using the upper separator 105, or the auxiliary grid 106 may be suspended in free space above the acceleration grid 104 and the upper separator 105 may be omitted.

Figure 12B:
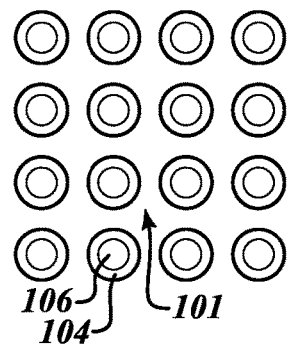
Figure 12C:
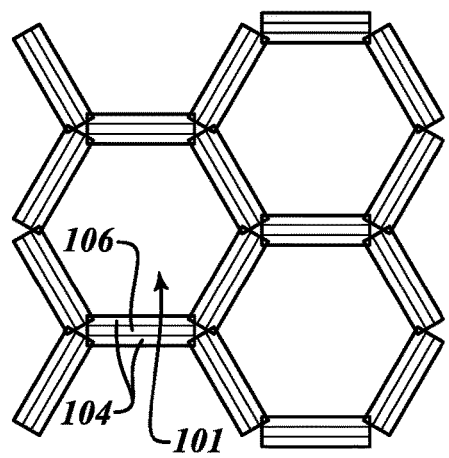

In some other embodiments and referring additionally to FIGS. 12B and 12C, devices may include layouts other than parallel lines for the vertical stack of the anode pillar 102, lower separator 103, acceleration grid 104, upper separator 105, and auxiliary grid 106. For example, as shown in FIG. 12B a grid of isolated stacks (including but not limited to circles) may repeat in both directions parallel to the anode base 101. As another example and as shown in FIG. 12C, line segments or curves may be connected in a structure that is more complex than parallel 2D lines, such as a "honeycomb" lattice.

In some other embodiments, the hot cathode 109 may be replaced by an alternative method of sending the charged particles 110 toward the grids 104 and 106 and the anode 101.

In some other embodiments, the anode pillar 102 and the anode base 101 may be combined into one material, which may for example be a curved structure that is highest underneath the lower separator 103 and lowest in the inter-pillar space 107.

In some embodiments in which either the acceleration grid 104 or the auxiliary grid 106 includes a film or coating, some such embodiments may include devices in which the film or coating is not present on some part of the acceleration grid 104 or the auxiliary grid 106. Some other such embodiments may also include devices in which a region where the film or coating is not present may be insulating or at a different voltage from the rest of the acceleration grid 104 or the auxiliary grid 106.

In some other embodiments, the auxiliary grid 106 may be electrically connected to the anode base 101 and the anode pillar 102, so that the auxiliary grid 106 is held at the same voltage as the anode base 101 and the anode pillar 102.

Illustrative Example No. 2 of Non-Co-Planar, Shadowed Grid Structure

A second illustrative application of a non-co-planar, shadowed grid structure is another electrostatically-protected grid in a vacuum electronic device.

Figure 13:
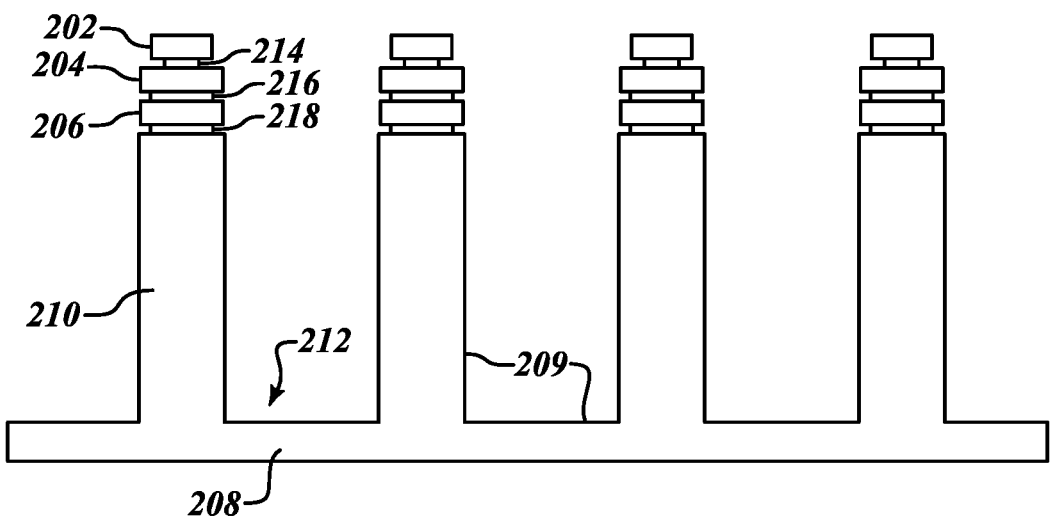
FIG. 13 is a cross section view of structure of another illustrative vacuum electronics device.

Referring additionally to FIG. 13, another illustrative, non-limiting embodiment of a vacuum electronics device is similar to that shown in FIG. 6 but without the overlapping grid structures shown in FIG. 6. The architecture shown in FIG. 13 is an adaptation of an over-hanging structure shown in FIG. 6 and performs in a similar manner. It will be appreciated that the embodiment shown in FIG. 13 can help to reduce the area of the grid that is non-conducting and more precisely steer electrons while reducing (and, in some cases, helping to minimize) grid loss and overcoming space charge. This can help mitigate dielectric charging to some of the grid and can contribute to further improving overall efficiency of the device.

The embodiment shown in FIG. 13 also differs from the embodiment shown in FIG. 6 in that the grid thicknesses are small enough to be compatible with most deposition processes used to produce layers made from conductive materials, such as by way of example only, metal or doped semiconductors, rather than entailing a thicker structure to be coated with a conductor or a thicker layer of bulk conductive materials. The embodiment shown in FIG. 13 entails a few microns thickness of conductive material to form the deposited grids. This embodiment also incorporates a high aspect ratio electron collection trench with straight sidewalls that can help improve electron collection on the anode and can help to make it easier for metallization and application of a low work function coating. While FIG. 13 illustrates a collection trench with approximately a 10:1 aspect ratio, it will be appreciated that other aspect ratios could be used. Thus, the embodiment shown in FIG. 13 can help contribute to reduction of dielectric charging, an increase in ease of fabrication, and increased efficiency.

As shown in FIG. 13, the architecture uses a vertical stack of three biased electrodes (grids) 202, 204, and 206. A silicon handle (substrate) 208 is patterned into pillars 210 and trenches 212 and repeats periodically. It will be appreciated that the trenches 212 are suitably deep in order to efficiently collect electrons that could potentially reflect off of the anode 208. The substrate 208 suitably is coated with a layer 209 of a metal, such as without limitation chromium, platinum, nickel, tungsten, molybdenum, niobium, or tantalum. The pillars 210 suitably are formed from etching away pits in the silicon handle (substrate) 208. Layers 214, 216, and 218 of dielectric (for example $SiO_2$ or $Si_xN_y$) are deposited and undercut relative to the pillar 210 and biased electrodes 202, 2014, and 206. Thus, the layers 214, 216, and 218 are shadowed grid supports for the grids 202, 204, and 206, respectively. To that end, the grid support 218 is disposed on top of the pillar 210, the grid 206 is disposed on top of the grid support 218, the grid support 216 is disposed on top of the grid 206, the grid 204 is disposed on top of the grid support 216, the grid support 214 is disposed on top of the grid 204, and the grid 202 is disposed on top of the grid support 214. It will be appreciated that each grid support 214, 216, and 218 is shadowed by its respective grid 202, 204, 206.

The bottom electrode (that is, the grid 206) is referred to as the bottom absorber grid and has a bias voltage in a range from +1 V to +10 V and a nominal bias voltage on the order of around +5 V. The middle electrode in the stack (that is, the grid 204) is referred to as the acceleration grid and a bias voltage in a range from +10 V to +30 volts and a nominal bias voltage on the order of around +20 V. It will be appreciated that the acceleration grid 204 accelerates charged particles towards a collecting area of the anode structure. The top electrode (that is, the grid 202) is referred to as the top absorber grid and has a bias voltage in a range from +0.5 V to +5 volts and a nominal bias voltage on the order of around +0.5 V. Thus, it will be appreciated that the absorber grids 202 and 206 absorb charged particles at a lower bias voltage than that of the acceleration grid 204.

In various embodiments the grids and the separators may be deposited via a process such as chemical vapor deposition, physical vapor deposition, evaporation, sputtering, electroplating, or atomic layer deposition.

In addition to reasons discussed above, the grid support 214 is undercut relative to the grid 202 in order to reduce (and in some cases to minimize) the exposed dielectric in the device. The purpose of the smaller grid 202 is to increase the space charge reduction (and in some cases mitigation) ability of the device architecture, while still maintaining ease of fabrication. In various embodiments, the grids 202, 204, and 206 may include without limitation nickel, silicon, platinum, tungsten, molybdenum, niobium, tantalum, copper, and/or rhenium.

Figure 14:
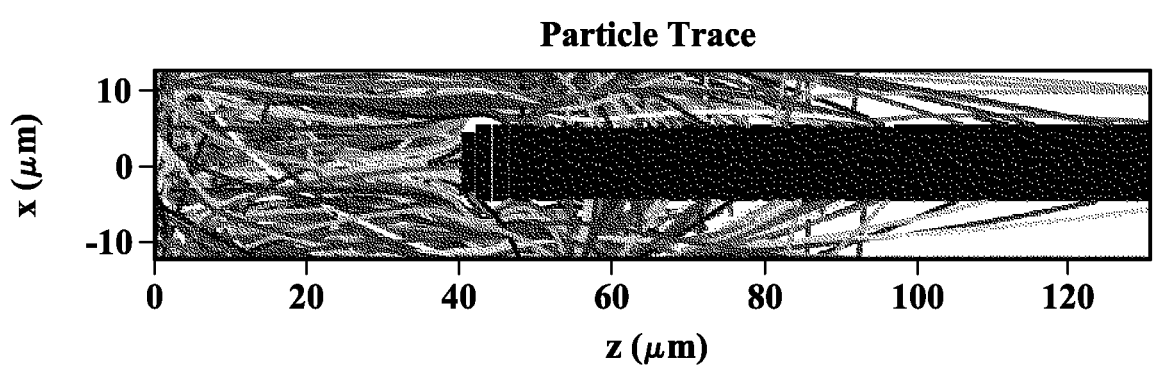
FIG. 14 illustrates calculated electron paths for the vacuum electronics device of FIG. 13.

Referring additionally to FIG. 14, a path is illustrated that electrons take around the grid structures under the design constraints described in reference to FIG. 13. The modeling of the electron paths shows a high number of the electrons hitting surfaces of the anode 208 where they will be effectively collected and contribute to the production of useful output current.

It will be appreciated that, while FIGS. 13 and 14 describe a grid structure with three electrodes, grid structures with three electrodes are shown by way of illustration only and not of limitation. To that end, disclosed embodiments are not limited to grid structures with three electrodes and no such limitation is to be inferred. As such, in various embodiments more than three electrodes can be used to further enhance the performance of the device. Thus, various embodiments include devices with more than three electrodes in each pillar 210. It will also be appreciated that various dimensions, aspect ratios, and voltages discussed in reference to FIGS. 13 and 14 have been given by way of illustration only and not of limitation. To that end, it will be appreciated that suitable dimensions, aspect ratios, and voltages may be selected as desired for a particular application.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken limiting.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

The herein described subject matter sometimes illustrates different components contained within, or connected with, different other components. It is to be understood that such depicted architectures are merely exemplary, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components, and/or wirelessly interactable, and/or wirelessly interacting components, and/or logically interacting, and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flows are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

Various example embodiments of the disclosed subject matter can be described in view of the following clauses:

1. A vacuum electronics device comprising:
    an electrode;
    a plurality of grid supports disposed on the electrode, each of the plurality of grid supports having a first width; and
    a plurality of grid lines, each of the plurality of grid lines being supported on an associated one of the plurality of grid supports, each of the plurality of grid lines having a second width that is wider than the first width.
2. The device of Clause 1, wherein the electrode includes a material chosen from chromium, platinum, nickel, tungsten, molybdenum, niobium, and tantalum.
3. The device of Clause 1, wherein the plurality of grid supports are patterned in a first film layer that includes a material chosen from a dielectric, an electrical insulator, a ceramic, silicon oxide, silicon nitride, and aluminum oxide.
4. The device of Clause 1, wherein the plurality of grid lines are patterned in a second film layer that includes an electrical conductor.
5. The device of Clause 4, wherein the electrical conductor includes a material chosen from chromium, platinum, nickel, tungsten, molybdenum, niobium, and tantalum.
6. The device of Clause 4, wherein the electrical conductor is disposed within an electrical insulator.
7. The device of Clause 1, wherein the plurality of grid supports, and the plurality of grids include a geometry chosen from a substantially straight line, a curved line, a circle array, a triangle array, and a hexagon array.
8. The device of Clause 1, further comprising:
    a layer of electrically conductive material disposed on the plurality of grids and the electrode.
9. The device of Clause 1, wherein the electrode is etched between the plurality of grid lines.
10. A method of fabricating a vacuum electronics device, the method comprising:
    providing an electrically conductive substrate;
    depositing a first film layer on the substrate;
    depositing a second film layer on the first film layer;
    defining a plurality of grid lines in the second layer; and
    selectively removing a portion of the first film layer underlying the plurality of grid lines to define a plurality of grid supports, each of the plurality of grid lines being supported on an associated one of the plurality of grid supports, each of the plurality of grid lines having a width that is wider than a width of each of the plurality of grid supports.

11. The method of Clause 10, further comprising:
depositing an electrically conductive film layer on the plurality of grid lines.

12. The method of Clause 11, further comprising:
depositing an electrically conductive film layer on the substrate.

13. The method of Clause 10, wherein depositing a first film layer on the substrate and depositing a second film layer on the first film layer are performed via a process chosen from chemical vapor deposition, physical vapor deposition, evaporation, sputtering, electroplating, and atomic layer deposition.

14. The method of Clause 10, wherein defining a plurality of grid lines in the second layer is performed via a process chosen from lithography, photolithography, electron-beam lithography, block co-polymer lithography, nanosphere lithography, nanoimprint lithography, self-aligned double patterning, and double patterning.

15. The method of Clause 10, wherein selectively removing a portion of the first film layer underlying the plurality of grid lines to define a plurality of grid supports is performed via a process chosen from wet etching, dry etching, plasma etching, ion bombardment, reactive-ion etching, isotropic etching, and anisotropic etching.

16. The method of Clause 10, further comprising selectively etching the first film layer and the second film layer to a geometry chosen from a substantially straight line, a curved line, a circle array, a triangle array, and a hexagon array.

17. A vacuum electronics device comprising:
an electrode;
a plurality of first grids disposed above the electrode in a first plane; and
a plurality of second grids disposed above the plurality of first grids in a second plane that is not co-planar with the first plane.

18. The device of Clause 17, further comprising:
a plurality of first grid supports disposed on the electrode and having a first width, the plurality of first grids being supported on the plurality of first grid supports and having a second width that is wider than the first width; and
a plurality of second grid supports disposed on the plurality of first grids and having a third width, the plurality of second grids being supported on the plurality of second grid supports and having a fourth width that is wider than the third width.

19. A method of fabricating a vacuum electronics device, the method comprising:
depositing a first layer of a first dielectric material on an electrode;
depositing a first layer of a second dielectric material on the first layer of the first dielectric material;
depositing a second layer of the first dielectric material on the first layer of the second dielectric material;
depositing a second layer of the second dielectric material on the second layer of the first dielectric material;
patterning the first and second layers of the first and second dielectric materials;
selectively undercutting the first and second layers of the first dielectric material; and
depositing a metal layer on the first and second layers of the second dielectric material and the electrode.

20. A method of fabricating a vacuum electronics device, the method comprising:
depositing a first layer of a first dielectric material on an electrode;
depositing a first layer of a second dielectric material on the first layer of the first dielectric material;
depositing a first layer of a metal on the first layer of the second dielectric material;
depositing a second layer of the first dielectric material on the first layer of the metal;
depositing a second layer of the second dielectric material on the second layer of the first dielectric material;
depositing a second layer of the metal on the second layer of the second dielectric material;
patterning the first and second layers of the first and second dielectric materials and the metal; and
selectively undercutting the first and second layers of the first dielectric material.

21. A vacuum electronic device comprising:
at least one first grid;
at least one second grid, the second grid being electrically isolated from the first grid, the second grid having a voltage bias applied independently from the first grid, the second grid bias and geometry set such that the electric field between the first grid and second grid prevents charged particles from striking the second grid.

22. The device of Clause 21, wherein the at least one first grid and the at least one second grid are physically connected to each other.

23. The device of Clause 21, wherein the biases on the grids are configured to electrostatically focus and/or direct charged particles.

24. The device of Clause 21, wherein the biases on the grids are configured to establish a dipole electric field.

25. The device of Clause 21, wherein the biases on the grids are configured to establish a dipole electric field that prevents charged particles from striking the second grid.

26. The device of Clause 21, wherein the at least one first grid and the at least one second grid are physically connected to each other via an associated one of a plurality of electrically insulating supports.

27. The device of Clause 26, wherein the plurality of electrically insulating supports are made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, aluminum nitride, and/or scandium oxide.

28. The device of Clause 21, wherein the at least one first grid and the at least one second grid are physically disconnected from each other.

29. The device of Clause 21, wherein the at least one first grid and the at least one second grid are physically connected to an electrode.

30. The device of Clause 21, wherein the at least one first grid and the at least one second grid are physically connected to an electrode via an associated one of a plurality of electrically insulating supports.

31. The device of Clause 30, wherein the plurality of electrically insulating supports are made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, aluminum nitride, and/or scandium oxide.

32. The device of Clause 21, wherein the first grid has voltage bias from negative ten to positive ten volts.

33. The device of Clause 21, wherein the second grid has voltage bias from negative one hundred to positive one hundred volts.
34. The device of Clause 21, wherein the first grid is comprised of one or more of silicon, tungsten, molybdenum, nickel, lanthanum, boron, lanthanum hexaboride, barium, niobium, tantalum, and/or rhenium.
35. The device of Clause 21, wherein the first grid includes one of a metal, a semiconductor, and an insulating material including one of a metallic coating and a semiconducting coating.
36. The device of Clause 21, wherein the second grid is comprised of one or more of silicon, tungsten, molybdenum, nickel, lanthanum, boron, lanthanum hexaboride, barium, niobium, tantalum, and/or rhenium.
37. The device of Clause 21, wherein the second grid includes one of a metal, a semiconductor, and an insulating material including one of a metallic coating and a semiconducting coating.
38. The device of Clause 30, wherein the electrode includes one of a metallic substrate, a semiconducting substrate, and an insulating substrate with one of a metallic coating and a semiconducting coating.
39. The device of Clause 30, wherein the electrode operates as an anode.
40. The device of Clause 21, wherein the widths of the grids is between 500 nanometers and 30 microns.
41. The device of Clause 21, wherein the device is fabricated via reactive ion etching.
42. The device of Clause 21, wherein the grid system is configured to generate electrical power.
43. The device of Clause 21, wherein the grid system is configured to generate electrical power via thermionic energy generation.
44. The device of Clause 21, wherein the grid voltages are optimized to generate the maximum possible amount of electrical power.
45. The device of Clause 21, wherein the grid voltages are optimized and tuned in time to generate the maximum possible amount of electrical power.
46. The device of Clause 21, wherein the grid voltages are optimized to generate electrical power at the maximum possible efficiency.
47. The device of Clause 21, wherein the grid voltages are optimized and tuned in time to generate power at the maximum possible efficiency.
48. The device of Clause 21, wherein the grids are disposed in front of a cathode.
49. The device of Clause 21, wherein the voltage of the first grid is configured to minimize power consumption when the first grid is struck by charged particles.
50. The device of Clause 30, wherein the electrode is coated with one or more of barium, cesium, scandium, lanthanum, cerium, cerium hexaboride, lanthanum hexaboride, cesium oxide, barium oxide, and/or cesium fluoride.
51. The device of Clause 21, wherein the first grid is positively biased.
52. The device of Clause 21, wherein the second grid is positively biased.
53. The device of Clause 21, wherein the first grid is biased to optimally focus and collimate a beam of charged particles.
54. The device of Clause 21, wherein the device has aspect ratio ranging from 5:1 to 100:1.
55. The device of Clause 21, wherein the device has aspect ratio ranging from 5:1 to 100:1.
56. The device of Clause 21, wherein the first grid has aspect ratio ranging from 5:1 to 100:1.
57. The device of Clause 21, wherein the first grid has aspect ratio ranging from 1:5 to 1:100.
58. The device of Clause 21, wherein the second grid has aspect ratio ranging from 5:1 to 100:1.
59. The device of Clause 21, wherein the second grid has aspect ratio ranging from 1:5 to 1:100.
60. The device of Clause 21, wherein the width of the second grid exceeds the width of the first grid.
61. A vacuum electronic device comprising:
at least two electrodes wherein one or more of the electrodes feature at least one concave notch in their cross-sectional geometries.
62. The device of Clause 61, wherein the at least two electrodes are physically connected to each other.
63. The device of Clause 61, wherein the at least two electrodes are physically connected to each other via an associated one of a plurality of electrically insulating supports.
64. The device of Clause 63, wherein the plurality of electrically insulating supports are made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, and/or scandium oxide.
65. The device of Clause 61, wherein the at least two electrodes are physically disconnected from each other.
66. The device of Clause 61, wherein the at least two electrodes are physically connected to an electrode.
67. The device of Clause 61, wherein the at least two electrodes are physically connected to an electrode via an associated one of a plurality of electrically insulating supports.
68. The device of Clause 67, wherein the plurality of electrically insulating supports are made from an electrically insulating material chosen from one or more of silicon oxide, silicon dioxide, silicon nitride, aluminum oxide, aluminum nitride, magnesium oxide, lanthanum oxide, yttrium oxide, hafnium oxide, zirconium oxide, and/or scandium oxide.
69. The device of Clause 61, wherein one electrode has voltage bias from negative ten to positive ten volts.
70. The device of Clause 61, wherein one electrode has voltage bias from negative one hundred to positive one hundred volts.
71. The device of Clause 61, wherein at least one electrode operates as an anode.
72. The device of Clause 61, wherein the at least two electrodes are comprised of one or more of silicon, tungsten, molybdenum, nickel, lanthanum, boron, lanthanum hexaboride, barium, niobium, tantalum, and/or rhenium.
73. The device of Clause 61, wherein the at least two electrodes include one of a metal, a semiconductor, and an insulating material including one of a metallic coating and a semiconducting coating.
74. The device of Clause 61, wherein the electrode includes one of a metallic substrate, a semiconducting substrate, and an insulating substrate with one of a metallic coating and a semiconducting coating.
75. The device of Clause 66, wherein the electrode operates as an anode.
76. The device of Clause 61, wherein the widths of the grids is between 500 nanometers and 30 microns.

77. The device of Clause 61, wherein the device is fabricated via reactive ion etching.
78. The device of Clause 61, wherein the concave notches are configured so as to minimize electrical shorting between the grids.
79. The device of Clause 61, wherein the concave notches are configured so as to maximize the surface pathlength between the grids.
80. The device of Clause 61, wherein at least one of the plurality of electrically insulating supports is configured so as to minimize electrical shorting between the grids.
81. The device of Clause 61, wherein at least one of the plurality of electrically insulating supports is configured so as to maximize the surface pathlength between the grids.
82. The device of Clause 61, wherein the grids are disposed in front of a cathode.
83. The device of Clause 61, wherein the notch has radius of curvature between 50 nanometers and 30 microns.
84. The device of Clause 61 wherein the notch is formed via reactive ion etching.
85. A vacuum electronic device comprising:
an electrode; and
a repeating pattern of high aspect ratio features disposed on the electrode.
86. The device of Clause 85, wherein the pitch between the features ranges from 1 to 10 microns.
87. The device of Clause 85, wherein the pitch between the features ranges from 10 to 50 microns.
88. The device of Clause 85, wherein the pitch between the features ranges from 50 to 100 microns.
89. The device of Clause 85, wherein the features comprise one or more electrically isolated grids.
90. The device of Clause 85, wherein the features comprise one or more insulating supports.
91. The device of Clause 85, wherein the features comprise one or more grids that are electrically isolated from each other by one or more insulating supports.
92. The device of Clause 85, wherein the features are made from materials chosen from one or more of silicon, nickel, silicon oxide, silicon dioxide, silicon nitride, aluminum oxide, aluminum nitride, magnesium oxide, lanthanum oxide, yttrium oxide, hafnium oxide, zirconium oxide, and/or scandium oxide.
93. The device of Clause 85, wherein the features are made from materials chosen from one or more of silicon, tungsten, molybdenum, nickel, lanthanum, boron, lanthanum hexaboride, barium, niobium, tantalum, rhenium, nickel, silicon oxide, silicon dioxide, silicon nitride, aluminum oxide, aluminum nitride, magnesium oxide, lanthanum oxide, yttrium oxide, hafnium oxide, zirconium oxide, and/or scandium oxide.
94. The device of Clause 85, wherein the features include one of a metal, a semiconductor, and an insulating material including one of a metallic coating and a semiconducting coating.
95. The device of Clause 85, wherein the aspect ratio of the features ranges from 2:1 to 5:1.
96. The device of Clause 85, wherein the aspect ratio of the features ranges from 5:1 to 10:1.
97. The device of Clause 85, wherein the aspect ratio of the features ranges from 10:1 to 50:1.
98. The device of Clause 85, wherein the features are formed via reactive ion etching.
99. The device of Clause 85, wherein the electrode operates as an anode.
100. The device of Clause 85, wherein the widths of the features is between 500 nanometers and 30 microns.
101. The device of Clause 85, wherein the electrode and the features are disposed in front of a cathode.
102. The device of Clause 85, wherein the features are configured to generate electrical power.
103. The device of Clause 85, wherein the features are configured to generate electrical power via thermionic energy generation.
104. The device of Clause 103, wherein the grid voltages are optimized to generate the maximum possible amount of electrical power.
105. The device of Clause 85, wherein the grid voltages are optimized and tuned in time to generate the maximum possible amount of electrical power.
106. The device of Clause 85, wherein the grid voltages are optimized to generate electrical power at the maximum possible efficiency.
107. The device of Clause 85, wherein the grid voltages are optimized and tuned in time to generate power at the maximum possible efficiency.
108. The device of Clause 103, wherein the grid voltages are optimized to collimate a beam of charged particles.
109. The device of Clause 103, wherein the grid voltages are optimized and tuned in time to collimate a beam of charged particles.
110. A vacuum electronics device comprising:
a substrate having a plurality of pillars patterned therein;
a plurality of first grid supports disposed on top of the plurality of pillars and having a first width;
a plurality of first electrically conductive grids disposed on top of the plurality of first grid supports and having a second width that is wider than the first width;
a plurality of second grid supports disposed on top of the plurality of first grids and having a third width;
and a plurality of second electrically conductive grids disposed on top of the plurality of second grid supports and having a fourth width that is wider than the third width.
111. A vacuum device comprising:
an anode structure including at least three conductive electrode grids, a third of the at least three electrode grids being biased at a voltage higher than the other two electrode grids, the third electrode grid being configured to accelerate charged particles towards a collecting area of the anode structure.
112. The device of Clause 111, wherein two of the electrode grids are configured to absorb charged particles at a lower bias voltage than the third electrode grid.
113. The device of Clause 111, wherein a center electrode grid is biased at a higher voltage than outer electrodes grids.
114. The device of Clause 111, wherein the anode structure includes more than three electrode grids, wherein electrode grids additional to three electrode grids are biased at low voltages for additional absorption of charged particles.
115. The device of Clause 111, wherein the anode structure includes more than three electrode grids, wherein electrode grids additional to three electrode grids are biased at high voltages for additional acceleration of charged particles.
116. The device of Clause 111, wherein the anode structure includes more than three electrode grids, wherein at least one electrode grid additional to three electrode grids is biased at low voltages for additional absorption of charged particles, and wherein at least one other electrode grid additional to three electrode grids is biased at high voltages for additional acceleration of charged particles.

117. The device of Clause 111, wherein the electrode grids include a conductive material.

118. The device of Clause 111, wherein the electrode grids include at least one material chosen from nickel, silicon, platinum, tungsten, molybdenum, niobium, tantalum, copper, and rhenium.

119. A vacuum electronics device comprising:
a conductive substrate having a plurality of pillars patterned therein;
a plurality of first grid supports disposed on top of the plurality of pillars and having a first width;
a plurality of first electrically conductive grids disposed on top of the plurality of first grid supports and having a second width that is wider than the first width;
a plurality of second grid supports disposed on top of the plurality of first grids and having a third width;
a plurality of second electrically conductive grids disposed on top of the plurality of second grid supports and having a fourth width that is wider than the third width;
a plurality of third grid supports disposed on top of the plurality of second grids and having a fifth width; and
a plurality of third electrically conductive grids disposed on top of the plurality of third grid supports and having a sixth width that is wider than the fifth width.

While a number of illustrative embodiments and aspects have been illustrated and discussed above, those of skill in the art will recognize certain modifications, permutations, additions, and sub-combinations thereof. It is therefore intended that the following appended claims and claims hereafter introduced are interpreted to include all such modifications, permutations, additions, and sub-combinations as are within their true spirit and scope.

What is claimed is:

1. A vacuum electronics device comprising:
an electrically conductive substrate having a plurality of pillars patterned therein;
a plurality of grid supports disposed on the plurality of pillars that are defined in the electrically conductive substrate, each of the plurality of grid supports having a first width; and
a plurality of grid lines, each of the plurality of grid lines being supported on an associated one of the plurality of grid supports, each of the plurality of grid lines having a second width that is wider than the first width.

2. The device of claim 1, wherein the electrically conductive substrate includes a material chosen from chromium, platinum, nickel, tungsten, molybdenum, niobium, and tantalum.

3. The device of claim 1, wherein the plurality of grid supports are patterned in a first film layer that includes a material chosen from a dielectric, an electrical insulator, a ceramic, silicon oxide, silicon nitride, and aluminum oxide.

4. The device of claim 1, wherein the plurality of grid lines are patterned in a second film layer that includes an electrical conductor.

5. The device of claim 4, wherein the electrical conductor includes a material chosen from chromium, platinum, nickel, tungsten, molybdenum, niobium, and tantalum.

6. The device of claim 4, wherein the electrical conductor is disposed within an electrical insulator.

7. The device of claim 1, wherein the plurality of grid supports and the plurality of grids grid lines include a geometry chosen from a substantially straight line, a curved line, a circle array, a triangle array, and a hexagon array.

8. The device of claim 1, further comprising:
a layer of electrically conductive material disposed on the plurality of grid lines and the electrically conductive substrate.

9. The device of claim 1, wherein the electrically conductive substrate is etched between the plurality of grid lines.

10. A vacuum electronics device comprising:
an electrically conductive substrate having a plurality of pillars patterned therein;
a plurality of first grids disposed in a first plane above the plurality of pillars that are defined in the electrically conductive substrate; and
a plurality of second grids disposed above the plurality of first grids in a second plane that is not co-planar with the first plane.

11. The device of claim 10, further comprising:
a plurality of first grid supports disposed on the plurality of pillars that are defined in the electrically conductive substrate and having a first width, the plurality of first grids being supported on the plurality of first grid supports and having a second width that is wider than the first width; and
a plurality of second grid supports disposed on the plurality of first grids and having a third width, the plurality of second grids being supported on the plurality of second grid supports and having a fourth width that is wider than the third width.

12. A vacuum electronics device comprising:
an electrically conductive substrate having a plurality of pillars patterned therein;
a plurality of first grid supports disposed on top of the plurality of pillars that are defined in the electrically conductive substrate and having a first width;
a plurality of first electrically conductive grids disposed on top of the plurality of first grid supports and having a second width that is wider than the first width;
a plurality of second grid supports disposed on top of the plurality of first grids and having a third width;
and a plurality of second electrically conductive grids disposed on top of the plurality of second grid supports and having a fourth width that is wider than the third width.

13. The device of claim 12, wherein the plurality of first electrically conductive grids and the plurality of second electrically conductive grids include a conductive material.

14. The device of claim 12, wherein the plurality of first electrically conductive grids and the plurality of second electrically conductive grids include at least one material chosen from nickel, silicon, platinum, tungsten, molybdenum, niobium, tantalum, copper, and rhenium.

15. The device of claim 12, wherein the substrate includes a material chosen from chromium, platinum, nickel, tungsten, molybdenum, niobium, and tantalum.

16. The device of claim 12, wherein the plurality of first grid supports and plurality of second grid supports are patterned in film layers that include a material chosen from a dielectric, an electrical insulator, a ceramic, silicon oxide, silicon nitride, and aluminum oxide.

17. The device of claim 12, wherein the plurality of first electrically conductive grids and the plurality of second electrically conductive grids are patterned in film layers that include an electrical conductor.

18. The device of claim 17, wherein the electrical conductor includes a material chosen from chromium, platinum, nickel, tungsten, molybdenum, niobium, and tantalum.

19. The device of claim 17, wherein the electrical conductor is disposed within an electrical insulator.

20. The device of claim 12, wherein the plurality of the plurality of first grid supports and the plurality of second grid supports and the plurality of first electrically conductive grids and the plurality of second electrically conductive grids include a geometry chosen from a substantially straight line, a circle array, and a hexagon array.

21. A vacuum electronics device comprising:
an electrically conductive substrate having a plurality of pillars patterned therein;
a plurality of first grid supports disposed on top of the plurality of pillars that are defined in the electrically conductive substrate and having a first width;
a plurality of first electrically conductive grids disposed on top of the plurality of first grid supports and having a second width that is wider than the first width;
a plurality of second grid supports disposed on top of the plurality of first grids and having a third width;
a plurality of second electrically conductive grids disposed on top of the plurality of second grid supports and having a fourth width that is wider than the third width;
a plurality of third grid supports disposed on top of the plurality of second grids and having a fifth width; and
a plurality of third electrically conductive grids disposed on top of the plurality of third grid supports and having a sixth width that is wider than the fifth width.

22. The device of claim 21, wherein the electrically conductive substrate includes a material chosen from chromium, platinum, nickel, tungsten, molybdenum, niobium, and tantalum.

23. The device of claim 21, wherein the plurality of first grid supports, the plurality of second grid supports, and the plurality of third grid supports are patterned in film layers that include a material chosen from a dielectric, an electrical insulator, a ceramic, silicon oxide, silicon nitride, and aluminum oxide.

24. The device of claim 21, wherein the plurality of first electrically conductive grids, the plurality of second electrically conductive grids, and the plurality of third electrically conductive grids are patterned in film layers that include an electrical conductor.

25. The device of claim 24, wherein the electrical conductor includes a material chosen from chromium, platinum, nickel, tungsten, molybdenum, niobium, and tantalum.

26. The device of claim 24, wherein the electrical conductor is disposed within an electrical insulator.

27. The device of claim 21, wherein the plurality of the plurality of first grid supports, the plurality of second grid supports, and the plurality of third grid supports and the plurality of first electrically conductive grids, the plurality of second electrically conductive grids, and the plurality of third electrically conductive grids include a geometry chosen from a substantially straight line, a circle array, and a hexagon array.

* * * * *